United States Patent [19]

Okase

[11] Patent Number: 5,571,010
[45] Date of Patent: Nov. 5, 1996

[54] HEAT TREATMENT METHOD AND APPARATUS

[75] Inventor: Wataru Okase, Sagamihara, Japan

[73] Assignees: Tokyo Electron Kabushiki Kaisha; Tokyo Electron Tohoku Kabushiki Kaisha, both of Japan

[21] Appl. No.: 262,057

[22] Filed: Jun. 17, 1994

[30] Foreign Application Priority Data

Jun. 18, 1993 [JP] Japan ................................ 5-172674
Sep. 30, 1993 [JP] Japan ................................ 5-268272

[51] Int. Cl.⁶ ............................................. F27D 3/00
[52] U.S. Cl. ......................... 432/239; 432/77; 432/121; 432/242
[58] Field of Search .................... 432/77, 82, 83, 432/120, 121, 239, 241, 242

[56] References Cited

U.S. PATENT DOCUMENTS

| | | | |
|---|---|---|---|
| 4,857,689 | 8/1989 | Lee | 219/10.71 |
| 5,000,682 | 3/1991 | Heidt et al. | 432/239 |
| 5,001,327 | 3/1991 | Hirasawa et al. | 219/390 |
| 5,148,714 | 9/1992 | McDiarmid | 74/89.15 |
| 5,249,960 | 10/1993 | Monoe | 432/77 |
| 5,360,336 | 11/1994 | Monoe | 432/77 |

FOREIGN PATENT DOCUMENTS 63-232422  9/1988  Japan .

Primary Examiner—Henry A. Bennett
Assistant Examiner—Siddharth Ohri
Attorney, Agent, or Firm—Beveridge, DeGrandi, Weilacher & Young, L.L.P.

[57] ABSTRACT

An object holder is raised, a mount portion is stopped at a middle stop position higher than a lower stop position, and an object of treatment is preheated. Thereafter, the object holder is further raised, the mount portion is stopped at an upper stop position in a processing tube higher than the middle position, and the object is heat-treated. A first temperature sensor for measuring a temperature on the obverse side of the object on the mount portion is located facing the obverse side. A second temperature sensor for measuring a temperature on the reverse side of the object on the mount portion is located facing the reverse side. The temperature of the object is detected in accordance with the respective outputs of the first and second temperature sensors. A secondary heat source is provided such that it emits secondary radiant heat rays toward the reverse of the object in a treatment position when it is heated by means of a primary heat source in the processing tube, thereby heating at least the peripheral edge portion of the object.

11 Claims, 21 Drawing Sheets

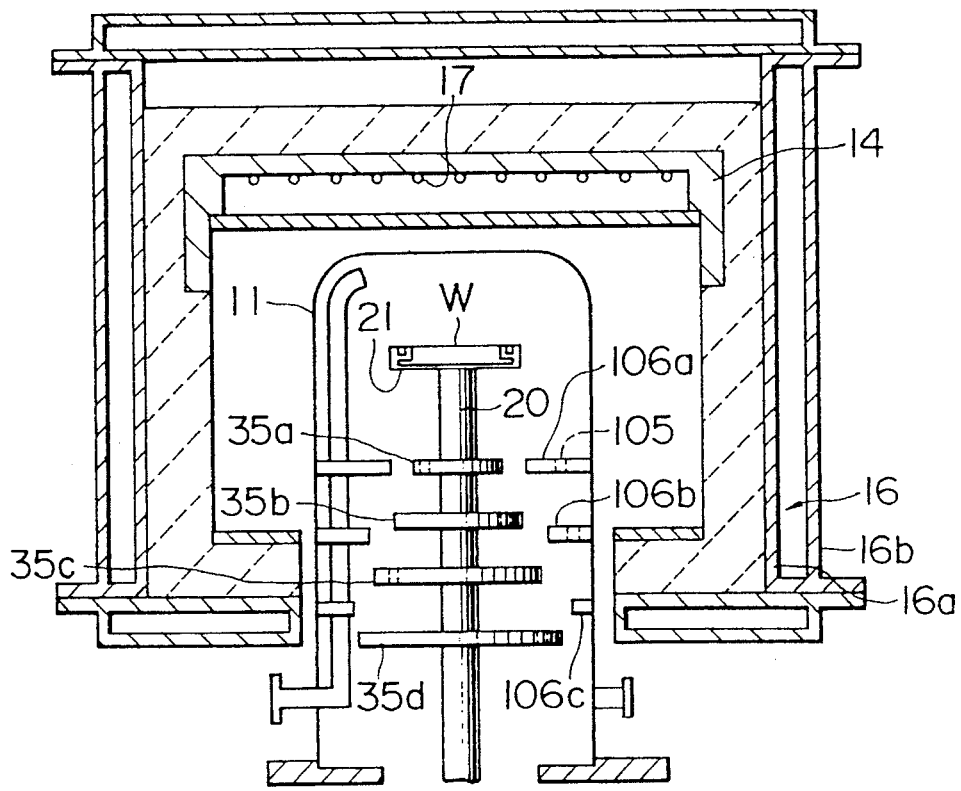
F I G. 25
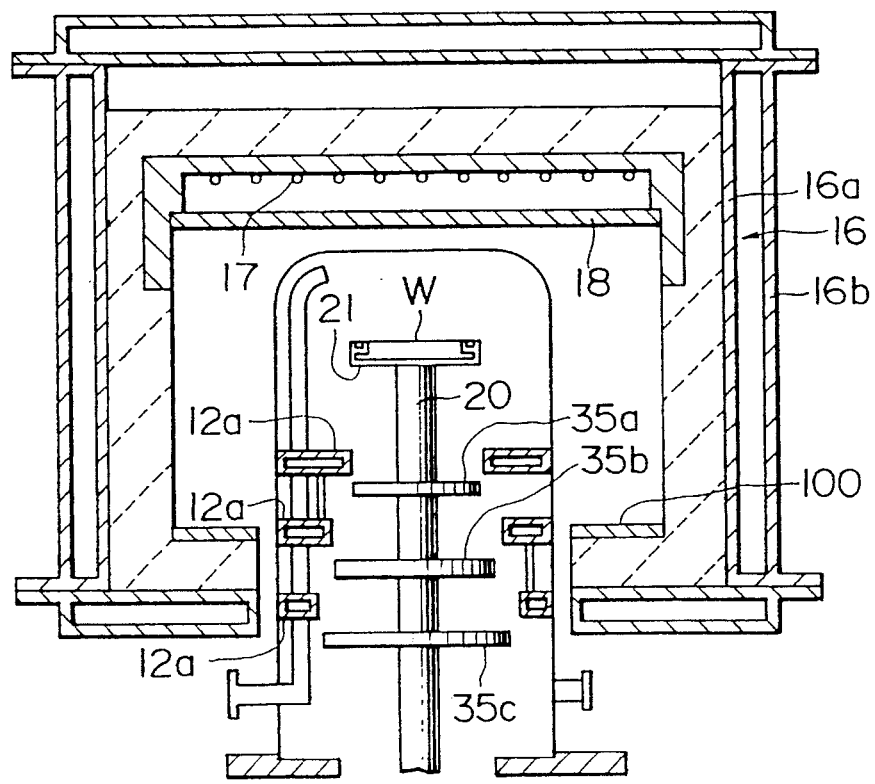
F I G. 26

HEAT TREATMENT METHOD AND APPARATUS

BACKGROUND OF THE INVENTION

The present invention relates to a heat treatment method and apparatus for heat-treating an object of treatment in a vertical processing tube.

Conventionally, in manufacturing processes for semiconductor devices, for example, various heat treatment apparatuses are used to form oxide films, thermal CVD films, high-purity, high-density regions by thermal diffusion, etc. on objects of treatment, such as semiconductor wafers, LCD substrates, and the like.

According to modern semiconductor processes, circuits are becoming finer and finer, and the wafer diameter tends to increase, i.e., from 8 inches to 12 inches. Besides wafers, large-sized substrates, such as LCD substrates, require the aforesaid heat treatments. In order to treat these objects having relatively large areas with high accuracy, the in-plane treatment characteristics of the objects must be equalized. To this end, in the various heat treatment apparatuses, the in-plane temperature distribution of the objects should be made uniform.

As the area of each object increases, however, more heat is released from the peripheral portion of the object than from the central portion. The larger the object area, therefore, the greater the difference in temperature between the central and peripheral portions of the object is. Thus, the uniformity of the in-plane temperature distribution of the object is lowered.

The various heat treatment apparatuses are expected to be improved in throughput. Since the object of treatment has a large area, however, it sometimes slips and warps as its temperature is quickly increased to a predetermined processing temperature. If the object temperature increases at high speed, the difference between temperatures at the central and peripheral portions of the object becomes very large in some cases.

In order to ensure the uniformity of the in-plane temperature distribution of the object, moreover, the object temperature must be measured accurately.

SUMMARY OF THE INVENTION

The object of the present invention is to provide a heat treatment apparatus, in which the uniformity of the in-plane temperature distribution of an object of treatment can be improved without causing a slip or distortion of the object during heat-up operation, so that the uniformity of the in-plane treatment characteristics of the object can be improved.

According to a first aspect of the present invention, there is provided a heat treatment method for heat-treating an object of treatment by means of a vertical processing tube having a bottom opening through which the object is loaded and unloaded and including an elevated heat source for heating the object in a treatment position, the heat treatment method comprising: a process for delivering the loaded object to a mount portion of an object holder in a lower stop position; a process for raising the object holder, stopping the mount portion at a middle stop position higher than the lower stop position, and preheating the object; a process for further raising the object holder, stopping the mount portion at an upper stop position in the processing tube higher than the middle position; and heat-treating the object; and a process for lowering the object holder after the end of the heat treatment and unloading the object from the mount portion in the lower stop position.

Thus, the object of treatment on the mount portion is stopped and preheated at the middle position in the course of movement to the treatment position. Accordingly, a sudden increase in temperature of the object can be restrained, so that the object can be prevented from slipping or warping. Also, the object can be uniformly preheated without increasing the in-plane temperature difference. Although the heating temperature or processing temperature of the object in the treatment position is at 700° C. or more, the middle position for preheating can be adjusted to a position where the temperature (e.g., 400° to 600° C.) for the best object heat absorption is obtained.

According to a second aspect of the invention, there is provided a heat treatment apparatus comprising: a vertical processing tube having a bottom opening through which an object of treatment is loaded and unloaded and including an elevated heat source for heating the object in a treatment position; an object holder including a mount portion for carrying the object thereon and used to load the object on the mount portion into the treatment position through the bottom opening of the processing tube; a first temperature sensor located facing the obverse side of the object on the mount portion and used to measure a temperature on the obverse side; a second temperature sensor located facing the reverse side of the object on the mount portion and used to measure a temperature on the reverse side; and means for detecting the temperature of the object in accordance with the respective outputs of the first and second temperature sensors.

Thus, the first and second temperature sensors are opposed to (i.e., they face) the obverse and reverse sides, respectively, of the object on the mount portion, and the temperature of the object is detected in accordance with the outputs of the first and second temperature sensors. Since there is a predetermined correlation between these two measured temperatures, the temperature of the object can be accurately measured on the basis of this correlation.

According to a third aspect of the invention, there is provided a heat treatment apparatus comprising: a vertical processing tube having a bottom opening through which an object of treatment is loaded and unloaded and including an elevated primary heat source for heating the object in a treatment position by radiation; an object holder including a mount portion for carrying the object thereon and used to load the object on the mount portion into the treatment position through the bottom opening of the processing tube; means for supplying a reaction gas to the treatment position in the processing tube; and a secondary heat source adapted to emit secondary radiant heat rays toward the reverse of the object in the treatment position when heated by means of the primary heat source, thereby heating at least the peripheral edge portion of the object.

According to a fourth aspect of the invention, there is provided a heat treatment apparatus comprising: a vertical processing tube having a bottom opening through which an object of treatment is loaded and unloaded and including an elevated heat source for heating the object in a treatment position; an object holder including a mount portion for carrying the object thereon and used to load the object on the mount portion into the treatment position through the bottom opening of the processing tube; means for supplying a reaction gas to the treatment position in the processing tube; and reflecting means for reflecting incident heat rays, emitted directly or indirectly from the heat source, on the reverse of the object, thereby heating at least the peripheral edge portion of the object.

Thus, according to the third and fourth aspects of the invention, the peripheral edge portion of the object which releases much heat, in particular, is heated from the reverse side of the object. In consequence, the in-plane uniformity of the treatment temperature of the object can be secured.

BRIEF DESCRIPTION OF THE DRAWINGS

FIG. 25 is a schematic front view of a heater unit according to a fifth modification of the apparatus of FIG. 19;

FIG. 26 is a schematic front view of a heater unit according to a sixth modification of the apparatus of FIG. 19;

DETAILED DESCRIPTION OF THE PREFERRED EMBODIMENTS

First Embodiment

Referring now to FIGS. 1 to 12, a heat treatment apparatus according to a first embodiment of the present invention will be described.

The heat treatment apparatus according to the present embodiment comprises a heat treatment unit 10, an object loading/unloading unit 40, and a shutter drive mechanism 55.

The heat treatment unit 10 performs various treatments for an object W of treatment, such as a semiconductor wafer or LCD. The unit 10 includes a processing tube 11 which is an open-bottomed cylindrical member. The processing tube 11 is formed of, for example, transparent quartz. That portion of the inner wall surface of the tube 11 which faces a treatment region of the object W is heat-proofed with alumina ($Al_2O_3$) or the like.

Figure 2:
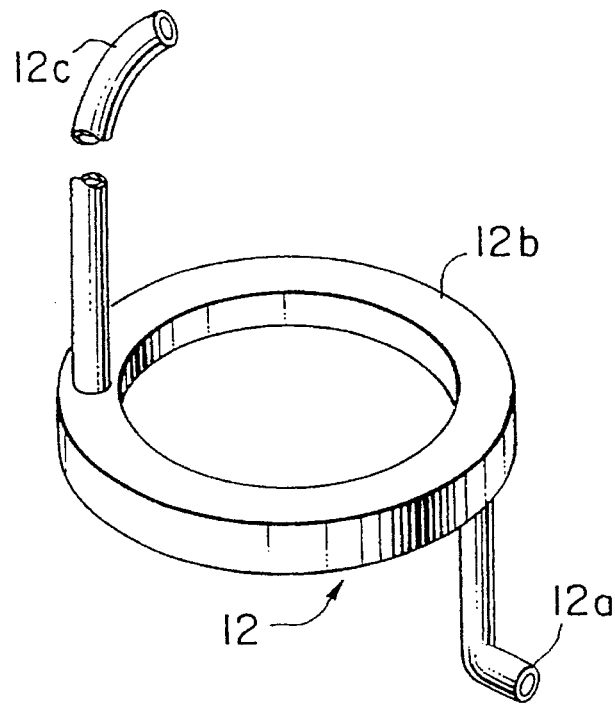
FIG. 2 is a perspective view of a gas charging pipe attached to the heat treatment apparatus shown in FIG. 1.

A gas charging pipe 12 for externally feeding a process gas is disposed in the processing tube 11. As is also shown in FIG. 2, the charging pipe 12 is provided with an inlet port 12a connected to a process gas source, a ring portion 12b located below a heat treatment position (P2) for the object W, and an outlet port 12c through which the gas is ejected into the top portion of the interior of the processing tube 11. The ring portion 12b temporarily stores the gas fed through the inlet port 12a as the gas is circulated in the tube 11. Also, the ring portion 12b serves to preheat the process gas. The circulating gas temporarily stored in the ring portion 12b is heated by absorbing the heat of an ambience gas below the heat treatment position (P2) for the object W, and is ejected thereafter from the outlet port 12c. Thus, the process gas is heated to a temperature near the reaction temperature before it is ejected, so that the time for this temperature rise can be saved.

The respective temperature gradients of the obverse and reverse of the object W are set in consideration of the absorption of the ambient gas heat by the ring portion (preheating portion) 12b. Radiator fins may be arranged on the outer surface of the ring portion 12b. Thus, the ambient heat can be efficiently transmitted to the process gas.

An exhaust pipe 13 for exhausting the process gas is provided in the vicinity of the bottom opening of the processing tube 11. The gas introduced into the tube 11 is caused to flow properly. This is conductive to the improvement of the uniformity of a film formed on the surface of the object W. The gas charging pipe 12 and the exhaust pipe 13, which are touched by the process gas, are coated with quartz or the like to be protected against contamination by a heavy metal.

A heat insulator 14 of, e.g., alumina ceramics overlies the processing tube 11. A heat insulator 15 of, e.g., glass-wool or asbestos is located over the insulator 14 and beside the tube 11.

A water cooling mechanism 16 formed of a water cooling jacket is provided on the outer wall surface of the heat insulator 15. The mechanism 16 is composed of inner and outer shells 16a and 16b, whereby the heat treatment unit 10 is thermally isolated from the outside. The safety of external operation can be ensured during high-temperature heat treatment in the heat treatment unit 10.

A plane heat source 17 is located over the processing tube 11. The heat source 17 is a resistance heating element which is formed of molybdenum disilicide ($MoSi_2$) or Kanthal wire (trademark), an alloy of iron, chromium, and aluminum. Molybdenum disilicide can stand a high temperature of 1,800° C. The plane heat source 17 may be formed of a spiral of a heating resistor wire. Preferably, the width of a heating surface of the heat source 17 should be made to be twice as large as the outside diameter of the object W or larger in consideration of the thermal efficiency.

A heat equalizing member 18 for equalizing heat from the plane heat source 17 applied to the object W is arranged between the processing tube 11 and the heat source 17 and on the processing-tube side portion of the heat insulator 15. The equalizing member 18 is formed of a material, such as silicon carbide (SiC), which enjoys a relatively low degree of contamination and a good thermal resistance. If the plane heat source 17 is subject to unevenness in heating, the heat equalizing member 18 removes this unevenness so that the temperature distribution is uniform. In general, heat release from the peripheral edge portion of the object W is often higher than one from the central portion within the plane of the object W, so that the in-plane temperature distribution of the object W is liable to become uneven. Since the heat equalizing member 18 is opposed to the peripheral edge portion of the object W, however, radiant heat applied to the peripheral edge portion is increased by means of the equalizing member 18, so that the uniformity of the in-plane temperature distribution of the object W is improved. Moreover, the equalizing member 18 is formed of the material which has a relatively low degree of contamination and a satisfactory thermal resistance, and the treatment space of the processing tube 11 is isolated entirely from the plane heat source 17. Even if the heat source 17 contains a heavy metal which may cause contamination, therefore, the contamination by the heavy metal can be effectively prevented in the treatment space of the tube 11.

Arranged in this manner, the heat treatment unit 10 is provided with an object holder 20 for lifting the object W.

Figure 3:
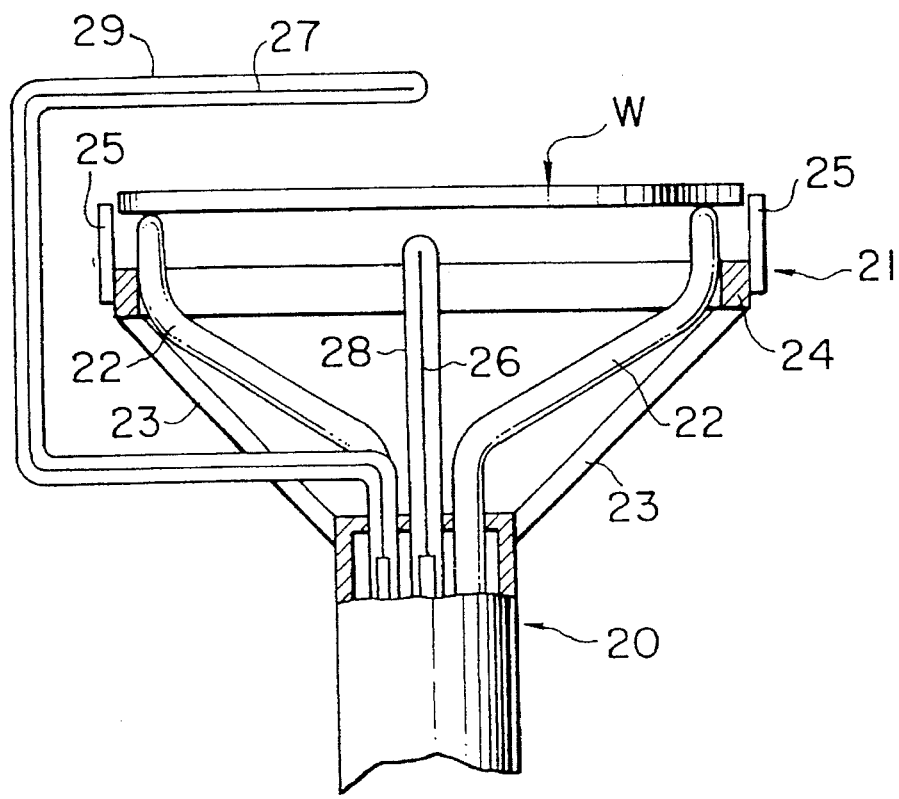
FIG. 3 is a front view, partially in section, showing a temperature detecting section of an object holder attached to the apparatus.

An object mount portion 21 is attached to the upper end of the object holder 20. As shown in FIG. 3, the mount portion 21 includes at least three capillary quartz tubes 22 which extend diagonally upward from the upper end of the object holder 20. The upper end of each capillary tube 22 is closed. Thus, the object W is supported at three points in its peripheral edge portion by means of the three capillary quartz tubes 22.

As shown in FIG. 3, moreover, the mount portion 21 is provided with at least three struts 23 which project diagonally upward from the upper end of the holder 20. A ring-shaped member 24 having substantially the same diameter as the object W is welded to the struts 23. Object positioning members 25 are attached individually to at least three points on the ring-shaped member 24. Thus, the object W can be held in place on the mount portion 21 by means of the positioning members 25.

Thermocouples 26 and 27 are arranged under and over the object W on the mount portion 21, respectively. The lower thermocouple (second temperature sensor) 26 is covered by a protecting tube 28 which is formed of a capillary quartz tube having a closed tip end. The upper thermocouple 27 is bent astride the mount portion 21 lest it interfere with the object W, and is situated on the obverse side of the object W. The tip end of the upper thermocouple 27 is opposed to the obverse of the object W, and is situated at a predetermined distance from the center of the object W. The thermocouples 26 and 27 cooperate with each other to detect the temperature of the object W, as mentioned later.

Figure 1:
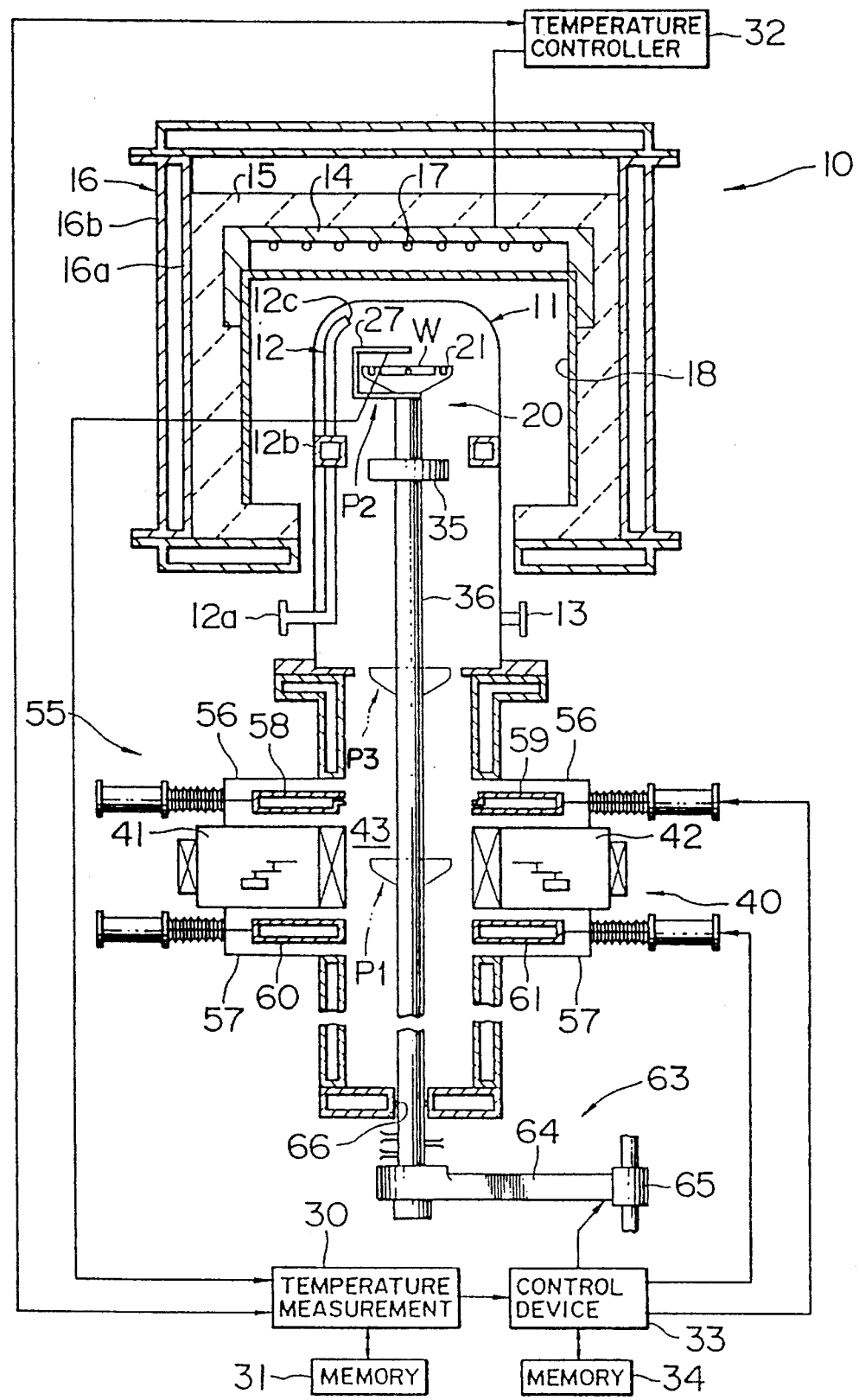
FIG. 1 is a schematic front view of a heat treatment apparatus according to a first embodiment of the present invention.

The thermocouples 26 and 27 are connected to a temperature measuring device 30 shown in FIG. 1. The measuring device 30 is connected to a memory 31, which stores data and programs, and a temperature controller 32 for controlling the temperature of the plane heat source 17. The output side of the measuring device 30 is connected to a control device 33, which is connected to the object holder 20, a lift drive mechanism 63, and first and second shutters 56 and 57, as mentioned later.

The following is a description of the control of the lift drive mechanism 63 for the object holder 20. As shown in FIG. 1, a lower limit position P1 for the holder 20 is a position where the object W is delivered to the holder 20, while an upper limit position P2 is a position where the object W is treated. An intermediate position P3 between these positions is a position where the holder 20 temporarily stops in the middle of its ascending stroke so that the object W is preheated.

Preferably, an ambient temperature detected by means of the thermocouple 27 on the obverse side of the object W ranges from 400° C. to 600° C. in the intermediate stop position P3. This temperature is a temperature at which the higher thermal efficiency can be enjoyed when the upper limit position (treatment position) P2 is reached by the object W. After the object W is preheated in the intermediate stop position P3, it is raised to the upper limit position P2 if temperatures at a plurality of spots on its reverse side are within a predetermined tolerance compared to temperatures at a plurality of spots on its obverse side.

During this preheating operation, the temperature measuring device 30 first determines, by the output of the first temperature sensor (thermocouple) 27, whether or not predetermined levels are reached by the obverse-side temperature of the object W and the ambient temperature, whereby a stop position for the object W is computed. At this time, the reverse-side temperature of the object W is detected by means of the second temperature sensor (thermocouple) 26, and it is determined by the temperature measuring device 30 whether or not the difference between the reverse- and obverse-side temperatures is within a given range. Thus, a stopping time (i.e., preheating temperature time) for the object W is computed.

The lift drive control for the holder 20 based on the information from the temperature measuring device 30 can be used only for teaching for the settlement of the intermediate stop position P3 and initial settlement of the stopping time (i.e., preheating time). In this case, position information on the intermediate stop position and information on the stopping time, set in accordance with the information from the measuring device 30, are loaded into a memory 34 which is connected to the control device 33. In continuously treating the objects W, thereafter, the control device 33 reads out the position information and the stopping time from the memory 34, thereby controlling the lifting operation of the holder 20.

Figure 4:
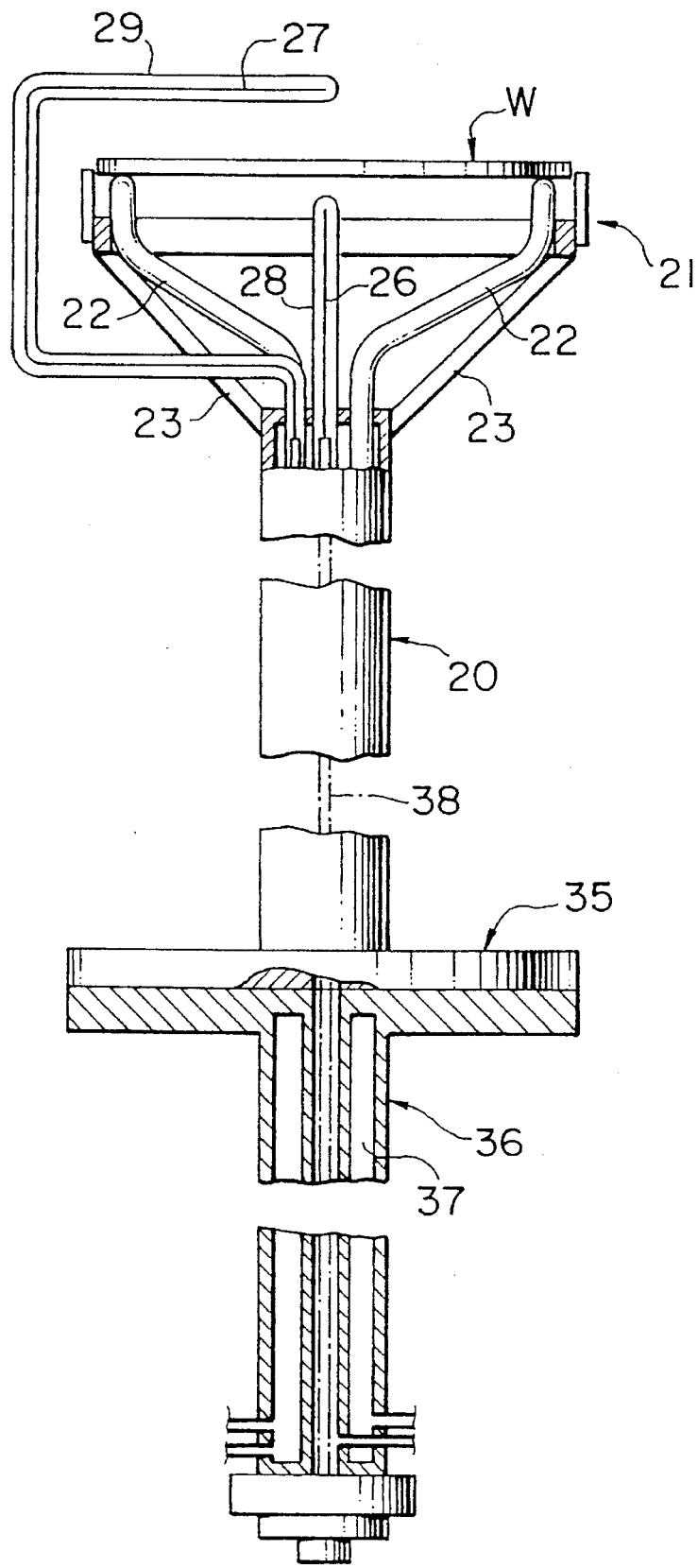
FIG. 4 is a front view, partially in section, showing the object holder attached to the apparatus.

As is also shown in FIG. 4 a heat shield member or flange 35 is located under the object holder 20. The shield member 35 serves to cut off radiant heat from the object loading/unloading unit 40 thereunder when the mount portion 21 of the holder 20 is situated in the treatment position in the processing tube 11.

A cooling rod 36 for cooling the heat shield member 35 extends downward from the underside of the member 35. The rod 36, which is formed of metal, has a water cooling jacket 37 therein. In FIG. 4, numeral 38 denotes lead wires for the thermocouples 26 and 27.

The following is a description of the object loading/unloading unit 40 for loading and unloading the objects W in an airtight manner.

Figure 5:
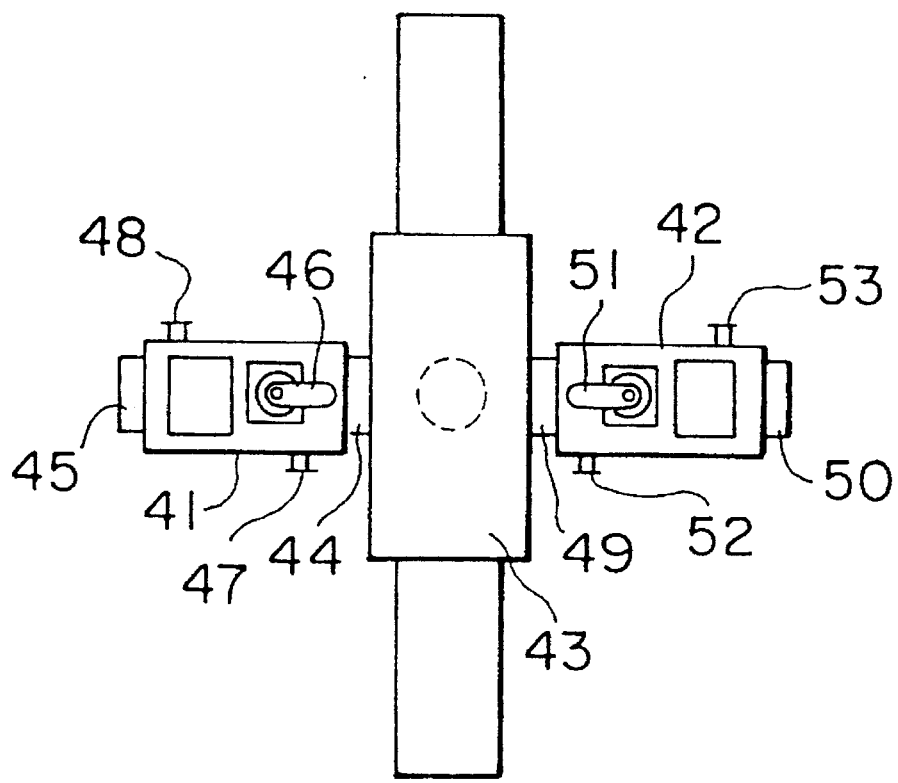
FIG. 5 is a schematic front view of an object loading/unloading unit attached to the apparatus.

As shown in FIGS. 1 and 5, the object loading/unloading unit 40 comprises first and second load locking chambers 41 and 42 and a delivery chamber 43 in which the objects are delivered from the chambers 41 and 42 to the mount portion 21 of the holder 20. The first and second load locking chambers 41 and 42 are constructed in the same manner with each other. The first chamber 41 is provided with first and second gate valves 44 and 45, an expansible transportation arm 46 capable of up-and-down motion and rotation, a gas inlet port 47, and a gas outlet port 48. The second chamber 42 is provided with first and second gate valves 49 and 50, an expansible transportation arm 51 capable of up-and-down motion and rotation, a gas inlet port 52, and a gas outlet port 53.

The gate valves 44, 45, 49 and 50 are opened when the objects W are delivered between the outside of the apparatus and the load locking chambers 41 and 42 or between the chambers 41 and 42 and the delivery chamber 43, and are opened when the chambers are kept airtight.

Each of the transportation arms 46 and 51 is composed of, for example, a multi-joint arm. The arms 46 and 51 serve to deliver the objects W between the outside of the apparatus and the load locking chambers 41 and 42 or between the chambers 41 and 42 and the delivery chamber 43.

The load locking chambers 41 and 42 are purged with, for example, $N_2$ gas through the gas inlet ports 47 and 52. Also, the chambers 41 and 42 are evacuated through the gas outlet ports 48 and 53.

The following is a description of the shutter drive mechanism 55 which adjoins the object loading/unloading unit 40.

Figure 6:
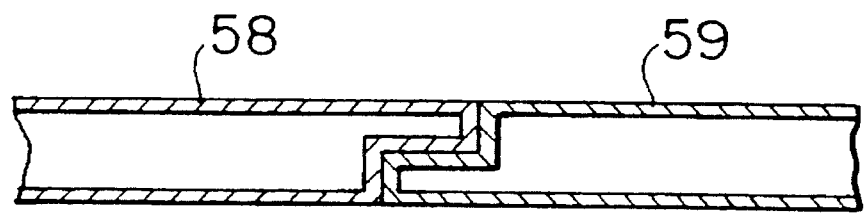
FIG. 6 is a sectional view showing a closed state of a first shutter attached to the apparatus.

As shown in FIG. 1, the first and second shutters 56 and 57 for use as heat shields are arranged, respectively, over and under the first and second load locking chambers 41 and 42. The first shutter 56 is provided with a pair of shutter plates 58 and 59 which are moved in opposite directions by means of cylinders or the like, individually, and the second shutter 57 with another pair of shutter plates 60 and 61 which are movable in like manner. Each shutter plate has an adiabatic structure with a water cooling jacket therein. As shown in FIG. 6, the respective opposite ends of the shutter plates 58 and 59 of the first shutter 56 are L-shaped. This configuration is intended to cut off the radiant heat from the processing tube 11, thereby preventing a temperature increase in the delivery chamber 43, when the opposite ends are brought intimately into contact with each other. Each of the shutter plates 58 and 59 is provided with a hole (not shown) through which the cooling rod 36 is passed.

Figure 7A:
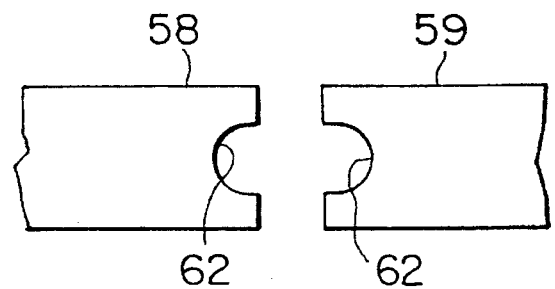
FIGS. 7A and 7B are plan views showing open and closed states, respectively, of another first shutter different from the one shown in FIG. 6.
Figure 7B:
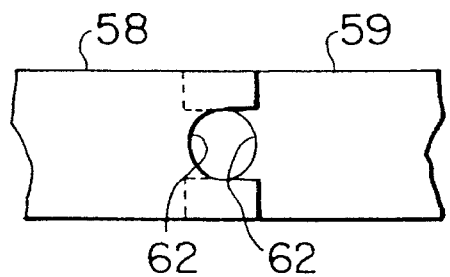

Alternatively, the shutter plates 58 and 59 may be designed so that their respective opposite ends can overlap each other, as shown in FIGS. 7A and 7B. FIGS. 7A and 7B show open and closed states, respectively, of the shutter plates 58 and 59. A semicircular notch 62 is formed in the distal end of each of the plates 58 and 59. Even when the shutter plates 58 and 59 are in the closed state, the cooling rod 36 can be passed through the notches 62, as shown in FIG. 7B.

The shutter plates 60 and 61 of the second shutter 57 are constructed in the same manner as the shutter plates 58 and 59.

The following is the reason why the radiant heat from the heat shield member 35 heated during the treatment is cut off when the lower limit position (delivery position) P1 is reached by the object W. When the object W is situated in the lower limit position P1, the shield member 35 heated during the treatment is situated below the second shutter 57. When the second shutter 57 is closed, therefore, the radiant heat from the shield member 35 is intercepted and prevented from rising. The first and second shutters 56 and 57 are controlled by means of the control device 33.

With this arrangement, the objects W can be delivered between the first and second load locking chambers 41 and 42 and the delivery chamber 43 in an ambient gas at a substantially normal temperature.

A cooling structure (not shown) for the object W is provided in an airtight chamber (delivery chamber 43) which is sealed up by the closed first and second shutters 56 and 57. A plurality of nozzles (not shown) for jetting a cooling gas are formed on the lateral portion of the airtight chamber so as to be arranged in the circumferential direction thereof. These nozzles eject the cooling gas substantially parallel to the object W on the mount portion 21 when the mount portion 21 is situated in the airtight chamber. An exhaust port (not shown) is located opposite the nozzles on the lateral portion of the airtight chamber. Thus, when the treated object W is returned to the airtight chamber sealed up by the closed shutters 56 and 57, it is cooled by means of the cooling gas from the nozzles. Thereupon, the object W is taken out at the normal temperature.

Alternatively, the cooling structure for the object W may be constructed as follows. The gap between the object on the mount portion 21 returned to the airtight chamber (delivery chamber 43) and the closed first shutter 56 may be minimized so that the object and the shutter are located very close to each other. In this case, cool air from the first shutter 56 is transferred to the object W to cool it.

The following is a description of the drive mechanism 63 for the object holder 20 and the cooling rod 36.

In the drive mechanism 63, as shown in FIG. 1, a lift arm 64 is connected to the lower end of the cooling rod 36. The arm 64 is moved up and down by means of a lift mechanism 65 which is formed of, for example, a ball screw (not shown) and a feed nut (not shown). Also, the lift arm 64 contains therein a rotating mechanism (not shown) for rotating the object holder 20 and the cooling rod 36. The holder 20 makes at least one revolution as it gets into or returns from the processing tube 11. This is done because the radiant heat from the plane heat source 17 is uniformly supplied so that the process gas is brought uniformly into contact with the object W. Thus, the in-plane temperature distribution of the object W is equalized. When the cooling gas is ejected from the nozzles after the object W is returned to the airtight chamber (delivery chamber 43) sealed up by the closed first and second shutters 56 and 57, moreover, the object holder 20 is rotated at a speed of, e.g., 60 rpm by means of the rotating mechanism.

The lift mechanism 65 moves the object W up and down with a scanty stroke with respect to the injection nozzles. This up-and-down motion is intended to ensure satisfactory contact of the cooling gas from the nozzles when the object holder 20 is fixed in a certain position. As shown in FIG. 1, a sealing structure 66 using a magnetic fluid is provided between the lower part of the cooling rod 36 and the airtight chamber. It serves to secure airtightness during the up-and-down motion of the rod 36.

Figure 12:
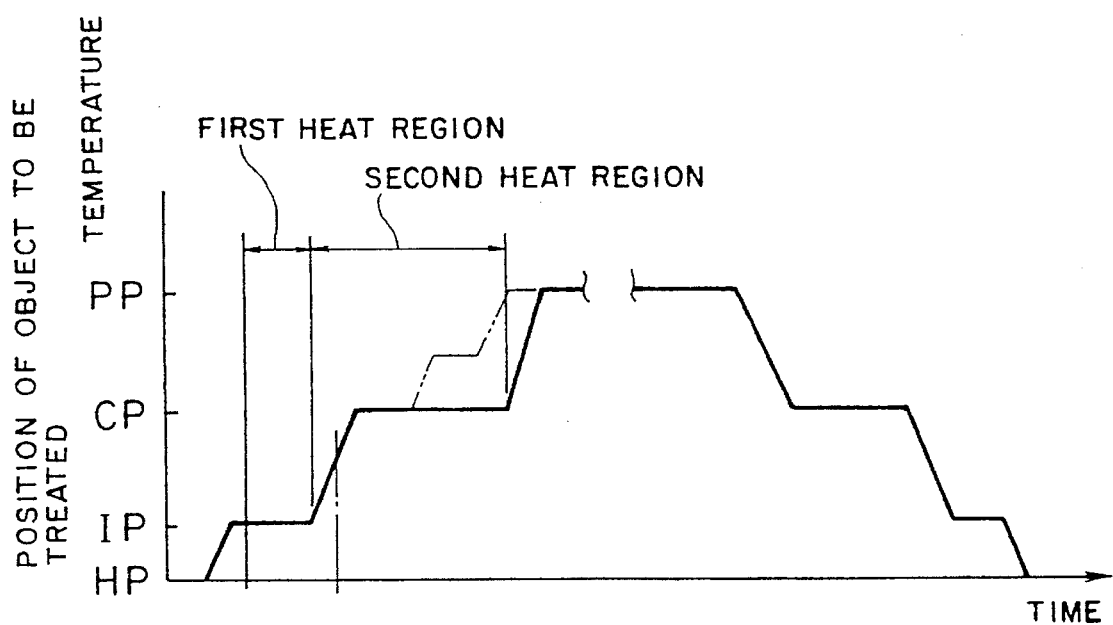
FIG. 12 shows characteristic curves for illustrating the position and temperature of an object of treatment during the operation shown in FIGS. 8 to 11.

The following is a description of the function of the heat treatment apparatus according to the first embodiment of the present invention. FIG. 12 is a diagram showing changes of temperatures in various positions of the object holder 20. In the graph of FIG. 12, the axes of abscissa and ordinate represent time and temperature, respectively. In FIG. 12, symbol HP indicates a home position which corresponds to the position P1 where the object W is delivered to the holder 20. Symbol IP indicates an initial position where the object W is subjected to primary preheating in its raised position close to the first shutter 56. Symbol CP corresponds to the intermediate stop position P3 where the object W is subjected to secondary preheating. Symbol PP corresponds to the treatment position (upper limit position) P2. The second load locking chamber 42 of the object loading/unloading unit 40 will now be described as a representative example.

(1) First, in loading the object W, the second load locking chamber 42 is purged with $N_2$ gas through the gas inlet port 52 so that its internal pressure is previously made equal to the atmospheric pressure. This is done in order to prevent penetration and scattering of dust which may be caused by a drastic gas flow when the gate valve 50 is opened. Then, the valve 50 is opened, and the object W is loaded into the second load locking chamber 42. Thereafter, the valve 50 is closed, and the chamber 42 is evacuated through the gas outlet port 53. By this time, the delivery chamber 43 and the processing tube 11 are evacuated in advance, and the first and second shutters 56 and 57 are closed.

Figure 8:
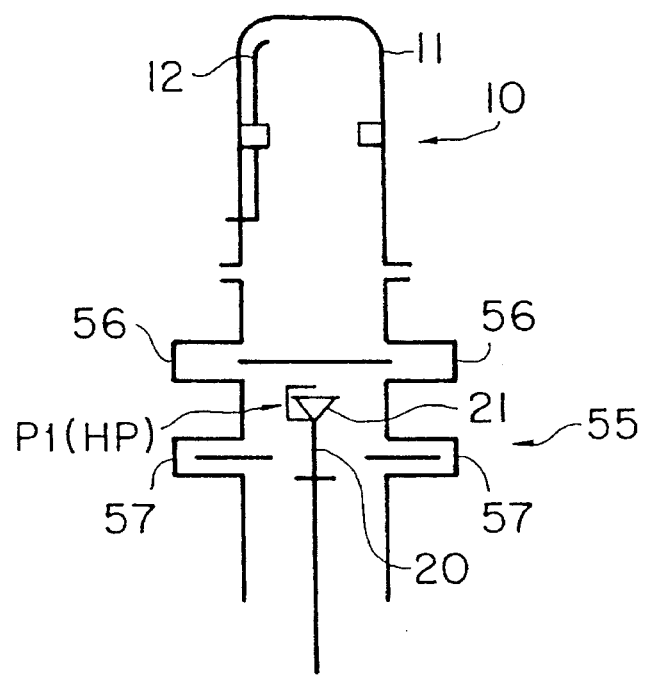
FIG. 8 is a schematic view showing an object delivery process of the apparatus.

The object W is loaded into the delivery chamber 43 by means of the transportation arm 51 of the load locking chamber 42, and is set on the mount portion 21 of the object holder 20 (lower limit position P1). If the temperature of the heat shield member 35 at this time is low, the second shutter 57 may be open, as shown in FIG. 8. On the other hand, the first shutter 56 is closed. Thus, the object loading/unloading unit 40 is prevented from being overheated by the radiant heat from the plane heat source 17 before the start of loading operation. At this time, moreover, the temperature of the object W is not increased, as indicated by symbol HP in FIG. 12.

Figure 9:
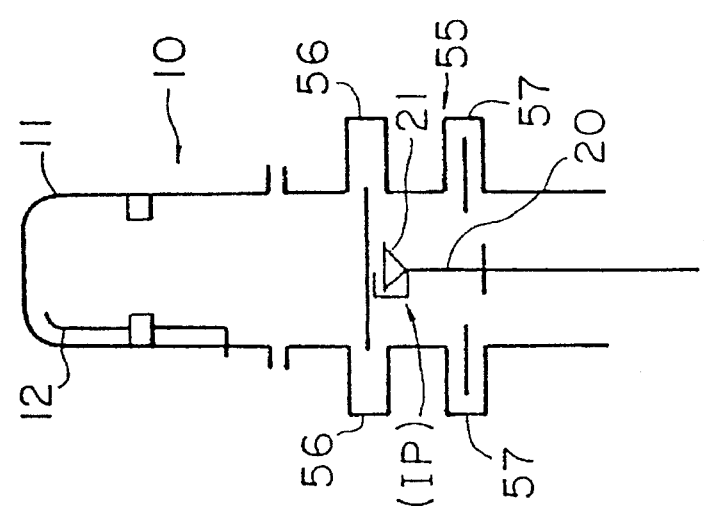
FIG. 9 is a schematic view showing a primary preheating process of the apparatus.

(2) When the delivery of the object W is completed, the object holder 20 is slightly raised by the drive mechanism 63, as shown in FIG. 9, and the rotation is started. The first shutter 56 is opened, and the radiant heat from the plane heat source 17 is applied directly to the surface of the object W. Thereupon, the primary preheating is effected in the initial position IP. Since the distance from the heat source 17 is relatively long, at this time, the temperature of the object W never undergoes a very sudden increase, and a uniform in-plane temperature increase can be enjoyed, as shown in FIG. 12.

Figure 11:
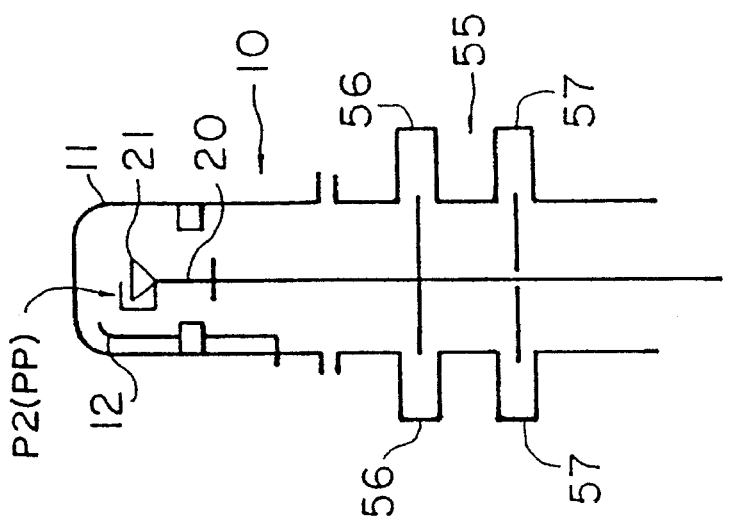
FIG. 11 is a schematic view showing another mode of operation provided by the apparatus.
Figure 10:
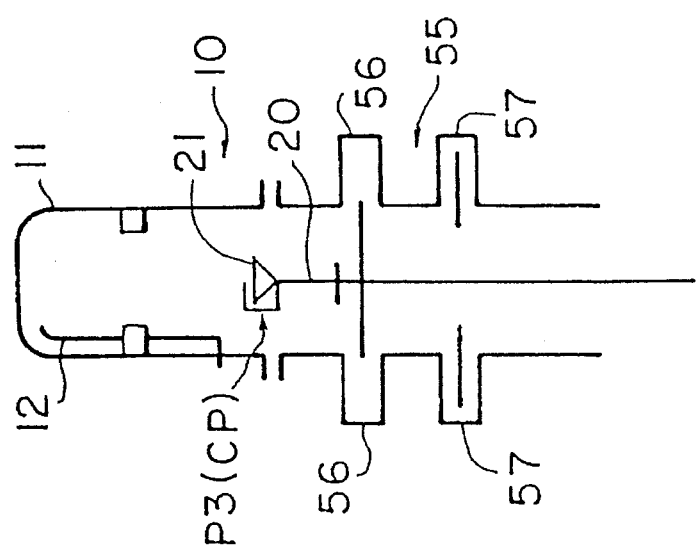
FIG. 10 is a schematic view showing a secondary preheating process of the apparatus.

(3) When the first shutter 56 is open, the object holder 20 rises and stops at the intermediate stop position P3 (position CP of FIG. 12), as shown in FIG. 10. Thereupon, the secondary preheating is effected. By this preheating, the temperature of the object W is increased to, e.g., 400° to 600° C., as shown in FIG. 12. This preheating is maintained until the temperature distribution on the reverse of the object W becomes uniform. Thereafter, the holder 20 rises and stops at the treatment position P2, as shown in FIG. 11.

(4) After reaching the treatment position P2, the object W is kept in a state for the best heat absorption factor by the secondary preheating. Accordingly, the time required for the attainment of the treatment temperature can be shortened. Since the object W in the treatment position P2 is not suddenly heated from the normal temperature, it cannot be caused to slip or warp during the heating operation in the treatment position P2. The first shutter 57 is closed when the holder 20 is moved to the position just above it. Thus, the temperature in the object loading/unloading Unit 40 can be prevented from being increased by the heat from the plane heat source 17.

In the secondary preheating process described above, preheating is conducted so that the best heat absorption factor can be obtained for heat treatment in the treatment position P2. Instead of effecting the secondary preheating once, a plurality of cycles of secondary preheating may be carried out by stages. In this case, the time required for the attainment of a set temperature for each stage can be further shortened. The primary preheating may be omitted.

At the end of the heat treatment, as shown in FIG. 12, the object W is precooled before it is returned to the object loading/unloading unit 40, in contrast with the aforesaid case for the movement to the treatment position. In this case, the object holder 20 is returned to the loading/unloading unit 40 after a near normal temperature is reached by the temperature of the object W. Then, the first shutter 56 is closed. Thus, the temperature of the object loading/unloading unit 40 is prevented from increasing as the object W is delivered.

Second Embodiment

Referring now to FIGS. 13 to 18, a heat treatment apparatus according to a second embodiment of the present invention will be described.

Figure 13:
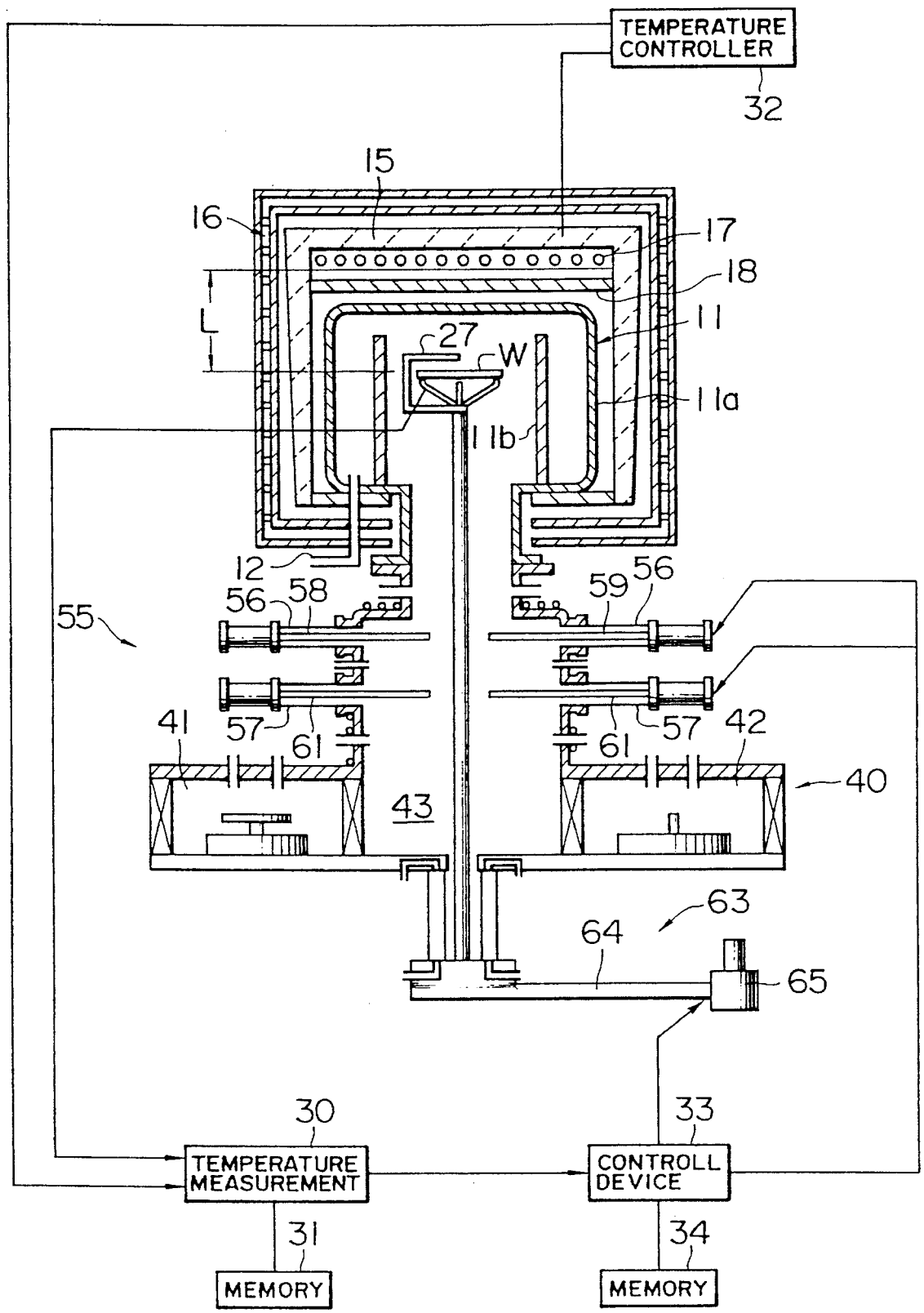
FIG. 13 is a schematic front view of a heat treatment apparatus according to a second embodiment of the invention.

As shown in FIG. 13, the heat treatment apparatus according to the second embodiment is characterized by the manner of temperature detection, and is constructed basically in the same manner as the heat treatment apparatus according to the first embodiment. In the description to follow, like portions or members are designated by like symbols or numerals for simplicity. However, the second embodiment differs slightly from the first embodiment in that a vertical-type processing tube 11 is composed of an outer tube 11a and an inner tube 11b inside the tube 11a, and that first and second shutters 56 and 57 are located above a delivery chamber 43.

In heat-treating an object of treatment, the temperature of the object is detected, and the ascending speed of a mount portion 21, film build-up on the object W, and heat treatment process are controlled in accordance with the detected temperature. In the initial stage of the treatment, therefore, a dummy object, in which thermocouples are directly mounted (or embedded), is set on the mount portion 21. The thermocouples are used to measure temperatures of the object W in various positions and record measurement data.

There has been a demand, on the other hand, that an actual value of the temperature of the object W should be measured during processing operation so that the ascending speed of the mount portion 21 and the like can be controlled thereby in the aforesaid manner. However, the dummy object W with the thermocouples can be used only in the initial stage of the treatment. Conventionally, therefore, that demand cannot be met.

According to the second embodiment, a temperature value as close to the actual value as possible is measured by means of a plurality of thermocouples on the obverse and reverse sides of the object W, even during the processing operation.

Figure 14:
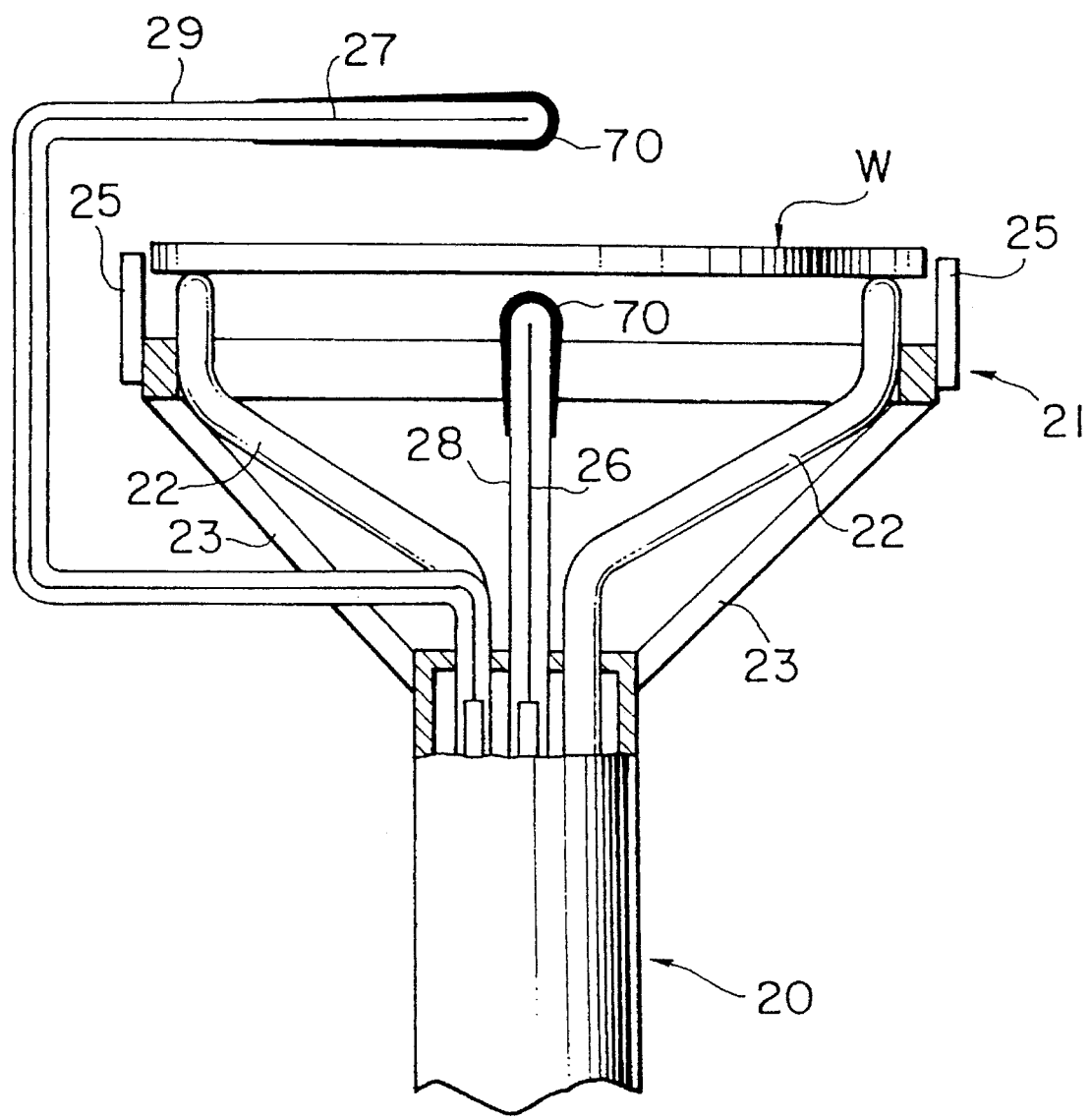
FIG. 14 is a front view, partially in section, showing a temperature detecting section of an object holder attached to the apparatus of FIG. 13.

More specifically, thermocouples 27 and 26 are arranged over and under the object W on the mount portion 21, respectively, as shown in FIG. 14. The lower thermocouple (second temperature sensor) 26 is covered by a protecting tube 28 which is formed of a capillary quartz tube having a closed tip end. Accordingly, the object W can be prevented from being shadowed. The upper thermocouple 27 is bent astride the mount portion 21 lest it interfere with the object W, and is situated on the obverse side of the object W. The tip end of the upper thermocouple 27 is opposed to the obverse of the object W, and is situated at a predetermined distance from the center of the object W. The thermocouples 27 and 26 cooperate with each other to detect the temperature of the object W, as mentioned later. The thermocouples 27 and 26 are connected to a temperature measuring device 30 shown in FIG. 13. The measuring device 30 is connected to a memory 31, which is stored with data and programs, and a temperature controller 32 for controlling the temperature of the plane heat source 17.

The following is a description of the process of detecting the temperature of the object W by means of the first and thermocouples 27 and 26. The heating conditions of the plane heat source 17 are supposed to be set so that the object W can be kept at a processing temperature of, e.g., 1,000° C. The mount portion 21 of the holder 20 is stopped at a position at a distance L from the heat source 17.

When the object W is moved to any of positions for preheating, treatment, etc., the first and second thermocouples 27 and 26 on the obverse and reverse sides of the object W detect, e.g., 1,020° C. and 980° C., respectively. The memory 31, which is connected to the temperature measuring device 30, is loaded with reference data for detecting the actual temperature of the object W in accordance with two temperature data obtained through the measurement by means of the first and second thermocouples 27 and 26.

The reference data are settled as follows, for example. The dummy object W with the thermocouples embedded therein is prepared and set on the mount portion 21, whereupon it is subjected to a heat treatment process. In doing this, actual temperature values of the dummy object in various positions, such as the preheating position, treatment position, etc., are measured by means of the thermocouples. These measured temperatures are stored as the reference data in the memory 31.

In the present embodiment, the two temperature data obtained by means of the first and second thermocouples 27 and 26 are linearly interpolated in accordance with the reference data, whereby the actual temperature of the object W is determined.

In the case where the processing temperature of the object W is adjusted to 900° C., the measured temperatures from the first and second thermocouples 27 and 26 are applied to the input of the temperature measuring device 30. If the first and second thermocouples 27 and 26 detect 920° C. and 880° C., respectively, then the temperature of the object W can be estimated at 900° C. by linear interpolation.

The relationships between the temperature of the object W and the measured temperatures given by the first and second thermocouples 27 and 26 are not limited to linear proportional relationships, and there may be any other correlations. These correlations may vary depending on the distance between the object W and the thermocouples 27 and 26 or the shape or size of the plane heat source 17. Also, the correlations may be influenced by the distance (L) between the heat source 17 and the object W. Preferably, therefore, the respective temperatures of the object W and the first and second thermocouples 27 and 26 should be previously measured under various processing temperature conditions and recorded as the reference data to be stored in the memory 31.

Referring now to FIGS. 13 and 14, operation for executing a film forming process will be described.

When the temperature of the object W is adjusted to a film forming temperature (e.g., 900° C.), a predetermined quantity of film forming gas is supplied through a gas inlet port 12. Thereupon, film formation on the object W is started.

At this time, there is a possibility of a film being formed on protecting tubes 28 and 29 of the first and second thermocouples, which are heated to about 900° C. and touched by the film forming gas, as well as on the object W. In FIG. 14, this film is denoted by numeral 70. The thickness of the film 70 increases with the number of film forming cycles executed repeatedly.

When the film on the protecting tubes 28 and 29 thus becomes relatively thick, heat reaching the object W is partially absorbed by the formed film so that the actual temperature of the object W is lowered even though the heat release value of the plane heat source 17 is fixed.

Accordingly, the actual temperature of the object W and the respective temperatures of the first and second thermocouples 27 and 26 obtained when the thickness of the film on the object W is changed are stored as correction data in the memory 31.

The thickness of the film on the protecting tubes 28 and 29 is correlative to the operating time of the apparatus after the start of processing. Accordingly, the relations between the current operating time and the individual measured temperatures are stored in the memory 31. Thus, the measured temperature data from the first and second thermocouples 27 and 26 are linearly interpolated, for example, in accordance with data for the current operating time and the correction data previously stored in the memory 31. Thereupon, the actual temperature of the object W is detected, and also, the thickness of the film on the object W is estimated.

As a result, the actual temperature of the object W can be accurately detected even when the temperatures of the first and second thermocouples 27 and 26 are lowered due to the film formation on the processing tube 11 or the protecting tubes 28 and 29. If the actual temperature of the object W is lower than the processing temperature, a control device 33, which receives the output of the temperature measuring device 30, controls a lift drive mechanism 63, thereby correcting the position of the object W so that it is situated closer to the plane heat source 17. Thus, even though the actual processing temperature cannot be obtained because the quantity of heat rays applied to the object W is reduced due to the film formation and the like, the treatment position for the object W can be quickly corrected so that the processing can be executed under the same conditions.

Figure 15:
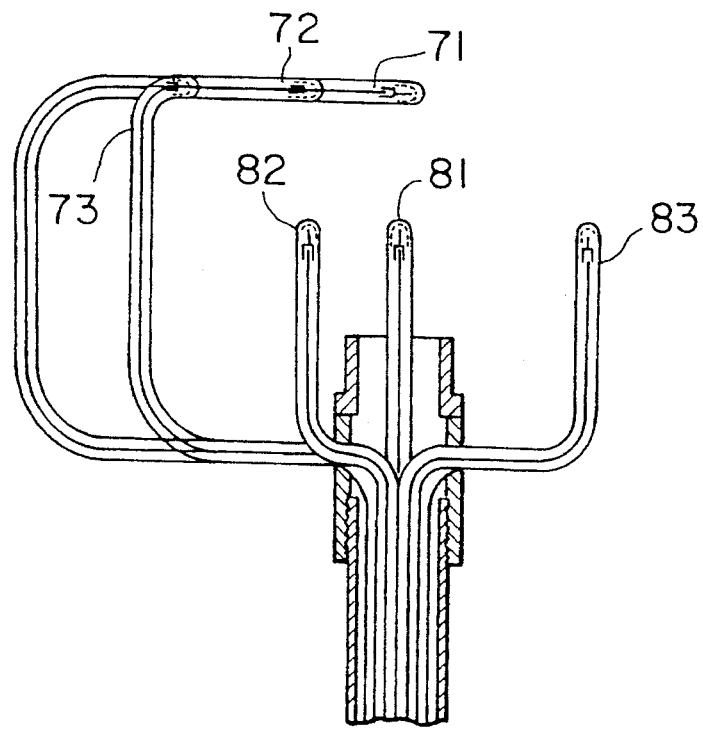
FIG. 15 is a schematic front view of a temperature detecting section according to a first modification of the second embodiment of the invention.
Figure 16:
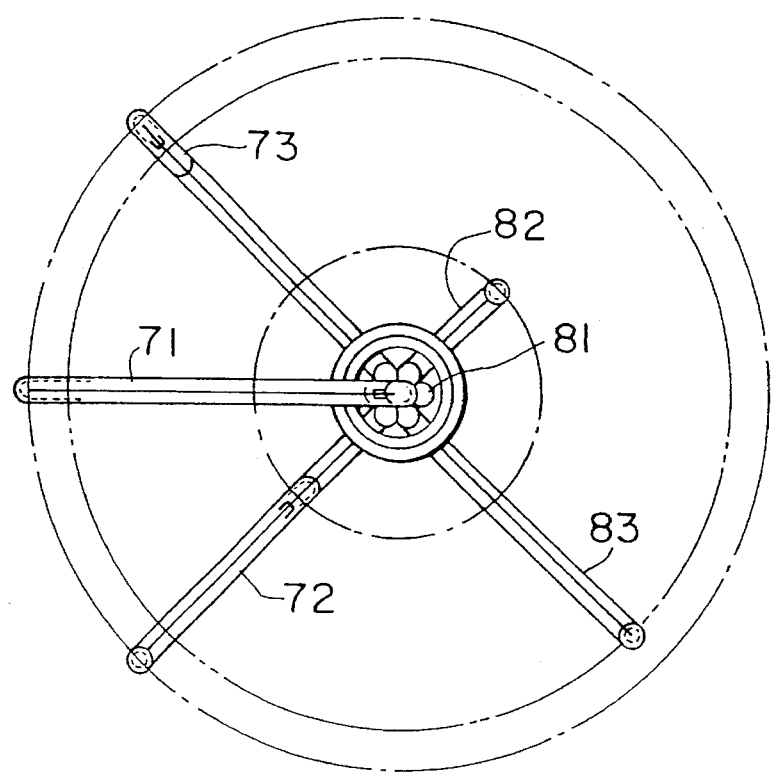
FIG. 16 is a schematic plan view of the temperature detecting section according to the first modification.

FIGS. 15 and 16 show a modification of the combination of the first and second thermocouples for measuring the obverse- and reverse-side temperatures, respectively, of the object. According to this modification, the temperature of the peripheral edge portion of the object W, as well as the central portion thereof, is measured.

As shown in FIGS. 15 and 16, three first thermocouples 71, 72 and 73 are arranged on the obverse side of the object W. These thermocouples 71, 72 and 73 extends astride the object W from below it to the obverse side. The thermocouples 71, 72 and 73 are used to measure the central portion of the obverse of the object, the region just outside the central portion of the obverse of the object, and the peripheral edge portion of the obverse of the object, respectively.

Three second thermocouples 81, 82 and 83 are arranged on the reverse side of the object W. The thermocouples 81, 82 and 83 are used to measure the central portion of the reverse of the object, the region just outside the central portion of the reverse of the object, and the peripheral edge portion of the reverse of the object, respectively. The thermocouples 71 and 81 are situated vertically corresponding to each other.

With use of these thermocouples 71, 72, 73, 81, 82 and 83, the temperatures of almost all regions of the object W can be measured at values as close to actual values as possible, so that the uniformity of the temperature distribution in the plane of the object can be maintained.

Since the thermocouples 71, 72 and 72 extend from one side from the object W to the obverse side thereof, they can be handled with ease.

Figure 17:
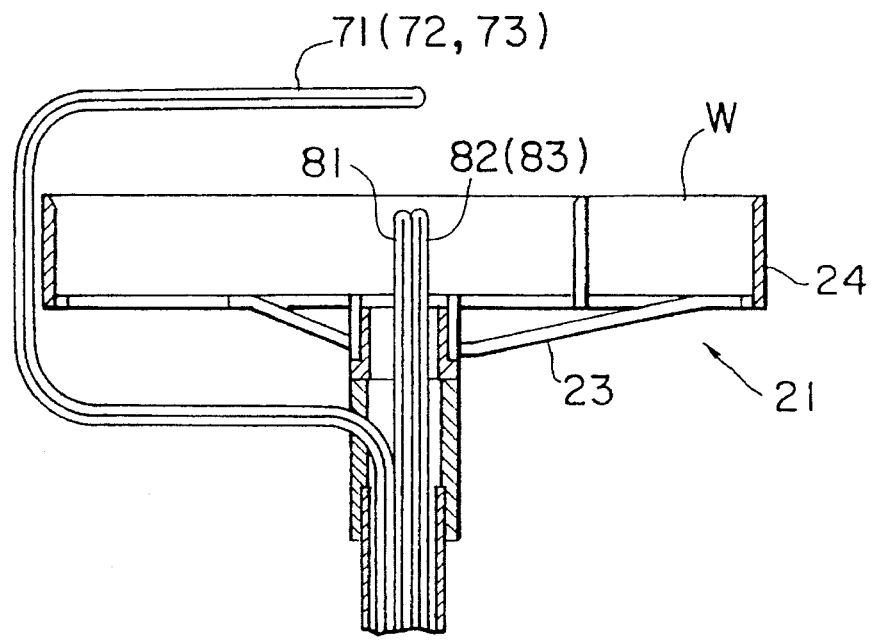
FIG. 17 is a schematic front view of a temperature detecting section according to a second modification of the second embodiment of the invention.
Figure 18:
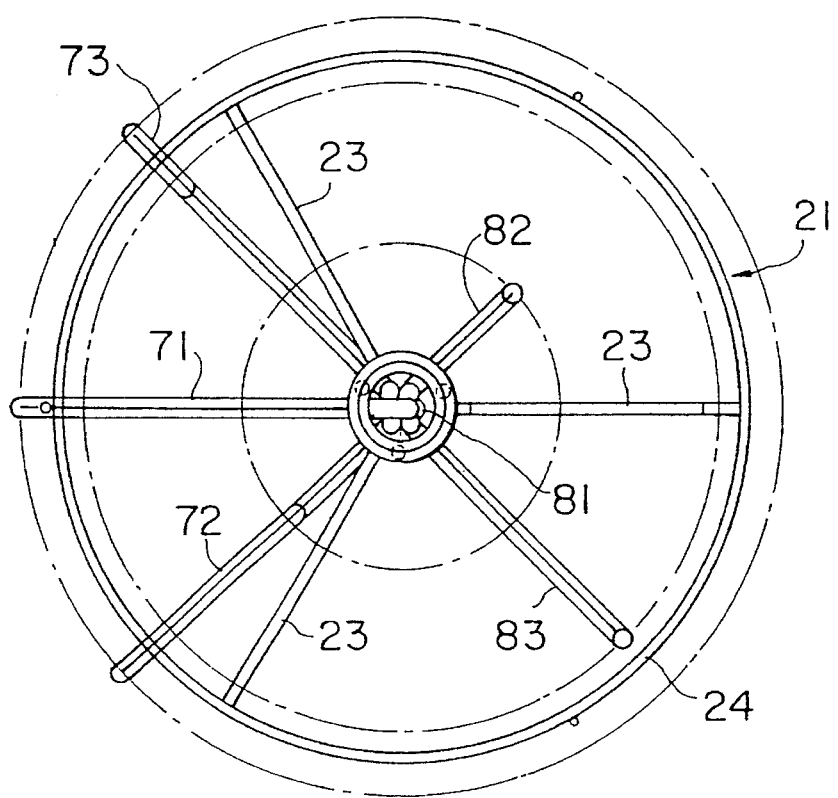
FIG. 18 is a schematic plan view of the temperature detecting section according to the second modification.

FIGS. 17 and 18 show another modification of the combination of the first and second thermocouples for measuring the obverse- and reverse-side temperatures, respectively, of the object.

Thermocouples 71, 72, 73, 81, 82 and 83 are arranged in the same manner as in the case of FIGS. 15 and 16. As shown in FIG. 3, moreover, a mount portion 21 is provided with at least three struts 23 which project diagonally upward from the upper end of a holder 20. A ring-shaped member 24, which carries the object W thereon, is welded to the struts 23. Alternatively, however, the object W may be supported by means of the thermocouples, or the struts 23 may be replaced with thermocouples. A mounting structure for the object W may be arranged in the manners shown in FIGS. 24 and 28.

Moreover, the distance between the object W and the thermocouples 71, 72, 73, 81, 82 and 83 ranges from 5 to 50 mm, preferably from 5 to 25 mm, without regard to the size of the object.

Third Embodiment

Referring now to FIGS. 19 to 29, a heat treatment apparatus according to a third embodiment of the present invention will be described.

In the description of the third embodiment to follow, like portions or members used in the first and second embodiments are designated by like symbols or numerals, and a description of those portions is omitted.

This third embodiment, like the first and second embodiments, is designed so that a plane heat source 17 is located over a processing tube 11. The heat source 17 serves as a primary heat source for heating the object W in the treatment position by radiation. As in the first and second embodiments, moreover, a heat equalizing member 18 for equalizing heat from the plane heat source 17 applied to the object W is arranged between the processing tube 11 and the heat source 17 and on the processing-tube side portion of a heat insulator 15. The equalizing member 18 serves as a secondary heat source which applies secondary radiant heat uniformly to the object W when heated by means of the plane heat source 17.

According to the third embodiment, furthermore, a heat equalizing member 100, separate from the heat equalizing member 18, is located parallel to the object W, in a position diagonally under the treatment position for the object W. This equalizing member 100 serves as a secondary heat source which applies secondary radiant heat to the reverse of the object W when heated by means of the plane heat source 17. The peripheral edge portion of the object W is heated by this secondary radiant heat. Although this peripheral edge portion releases a relatively large quantity of heat, its heat radiation is restrained by heating with the secondary radiant heat. Thus, the temperature of the peripheral edge portion can be kept uniform, so that change of the temperature distribution of the object W can be restrained.

The heat equalizing member 100 on the reverse side is not limited to the type which applies the secondary radiant heat, and may be of a reflection type which has a ground surface layer (specular surface). In this case, radiant heat rays from the heat equalizing member 18 on the obverse side or heat rays from the plane heat source 17 reach the obverse of the object W in a direct or indirect manner, and also reach the equalizing member 100 on the reverse side. After reaching the equalizing member 100, the radiant heat rays or the radiant rays are reflected by the ground layer of the member 100, and then reach the reverse of the object W. Thereupon, the peripheral edge portion of the object W is heated. Although this peripheral edge portion releases a relatively large quantity of heat, its heat radiation is restrained by heating with the secondary radiant heat. Thus, the temperature of the peripheral edge portion can be kept uniform, so that change of the temperature distribution of the object W can be restrained. This reflection type can be formed of, e.g., silicon carbide (SiC).

Figure 20:
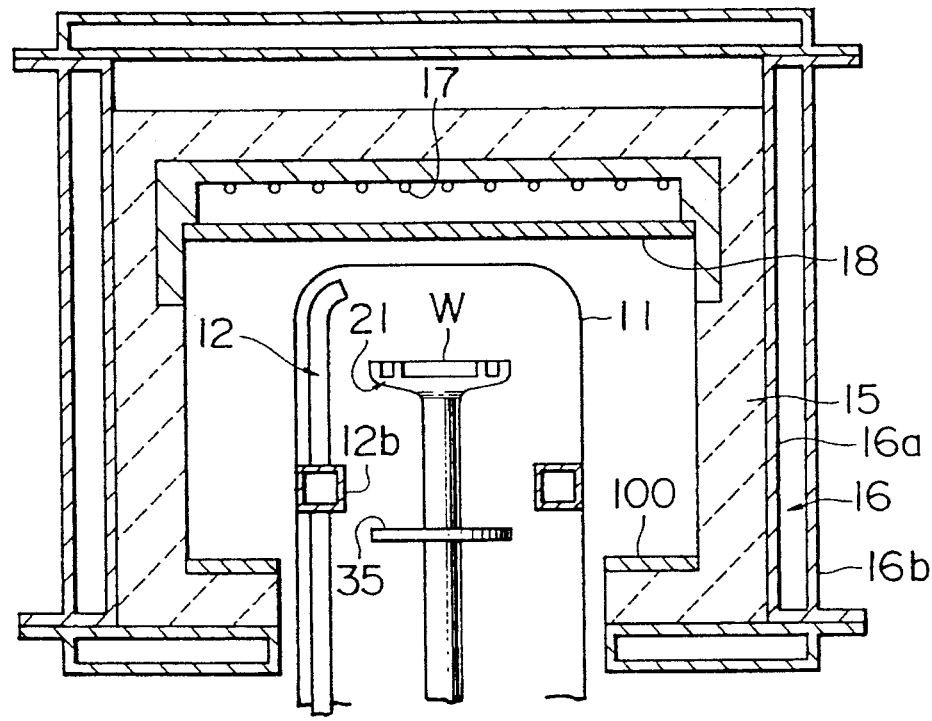
FIG. 20 is a schematic front view of a heater unit according to a first modification of the apparatus of FIG. 19.

The heat equalizing members 18 and 100 may be constructed in the manner shown in FIG. 20. In FIG. 20, the equalizing member 18 is located only over the processing tube 11, and that portion beside the tube 11 is omitted. Also in this case, the equalizing member 18 serves as a secondary heat source which applies secondary radiant heat uniformly to the object W when heated by means of the plane heat source 17. The equalizing member 100 on the reverse side may be of the type which applies the secondary radiant heat or the reflection type having the ground surface layer (specular surface).

Figure 21:
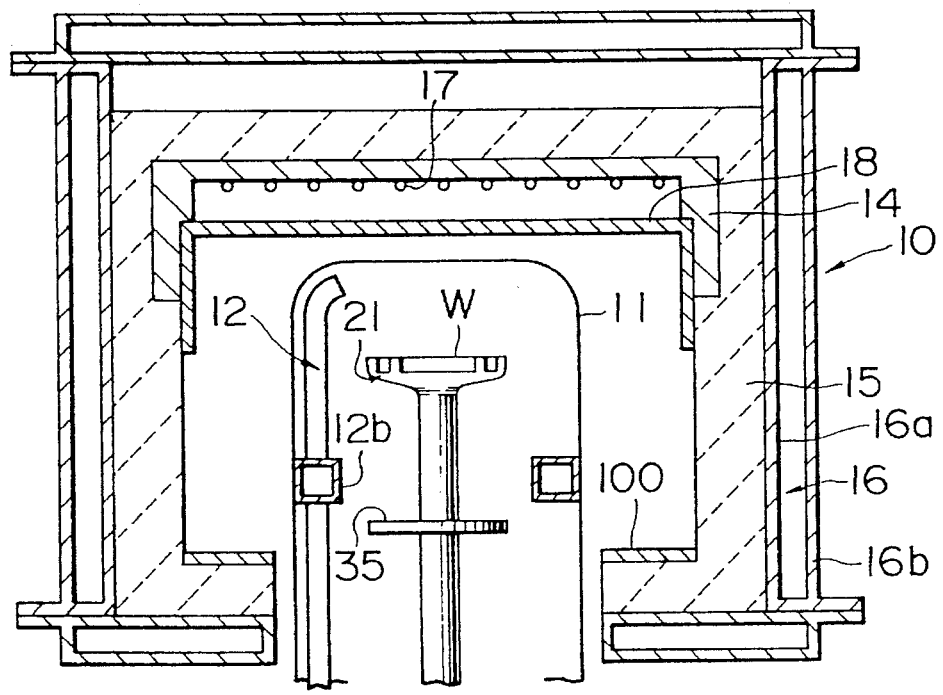
FIG. 21 is a schematic front view of a heater unit according to a second modification of the apparatus of FIG. 19.

Moreover, the heat equalizing members 18 and 100 may be constructed in the manner shown in FIG. 21. In FIG. 21, the equalizing member 18 on the obverse side hangs down from its top position to the level of the position where the object W is situated. In this case, heating of the peripheral edge portion of the object W is accelerated on both the obverse and the reverse, so that the temperature can be prevented from being lowered by heat radiation from the peripheral edge portion.

Figure 22:
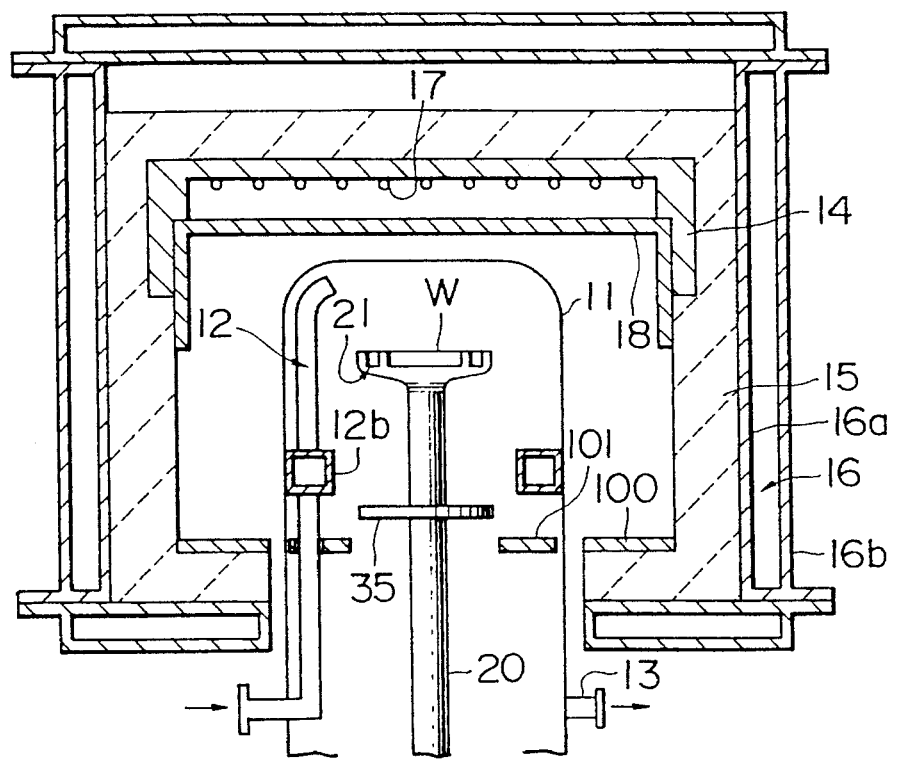
FIG. 22 is a schematic front view of a heater unit according to a third modification of the apparatus of FIG. 19.

Further, the heat equalizing members may be constructed in the manner shown in FIG. 22. In FIG. 22, another heat equalizing member 101 is provided in a position diagonally under the object W in the processing tube 11. This equalizing member 101 is situated in a region such that it never interferes with the course of up-and-down motion of the object W. Since the equalizing member 101 is previously heated by means of the plane heat source 17 before the object W is loaded, it can heat the peripheral edge portion of the object W.

Figure 23:
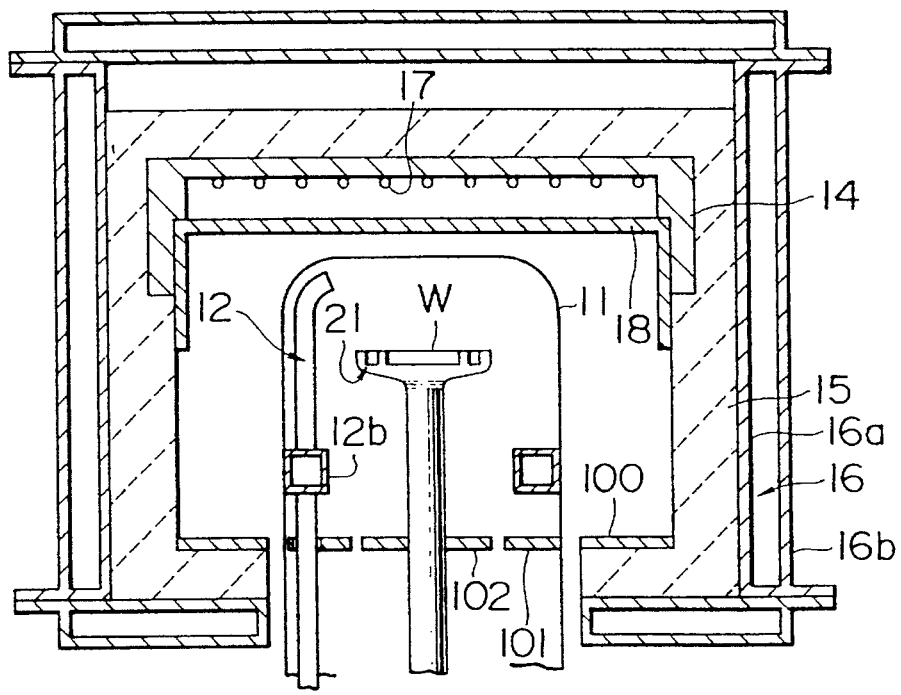
FIG. 23 is a schematic front view of a heater unit according to a fourth modification of the apparatus of FIG. 19.

Furthermore, the heat equalizing members may be constructed in the manner shown in FIG. 23. In FIG. 23, another heat equalizing member 102 is mounted on an object holder 20.

Thus, the heat equalizing members can heat the reverse of the object W, especially the peripheral edge portion thereof, as well as the obverse. Accordingly, the in-plane uniformity of the object W can be maintained without lowering the temperature of the peripheral edge portion of the object W from which a large quantity of heat is radiated. In the case where the equalizing members are formed of silicon carbide or other material which enjoys a good thermal resistance and a low degree of contamination, moreover, the treatment space of the processing tube 11 is thermally isolated from the heat source 17. Even if the heat source 17 is formed of a material containing a heavy metal which may cause contamination, therefore, the contamination by the heavy metal can be prevented effectively.

Figure 24:
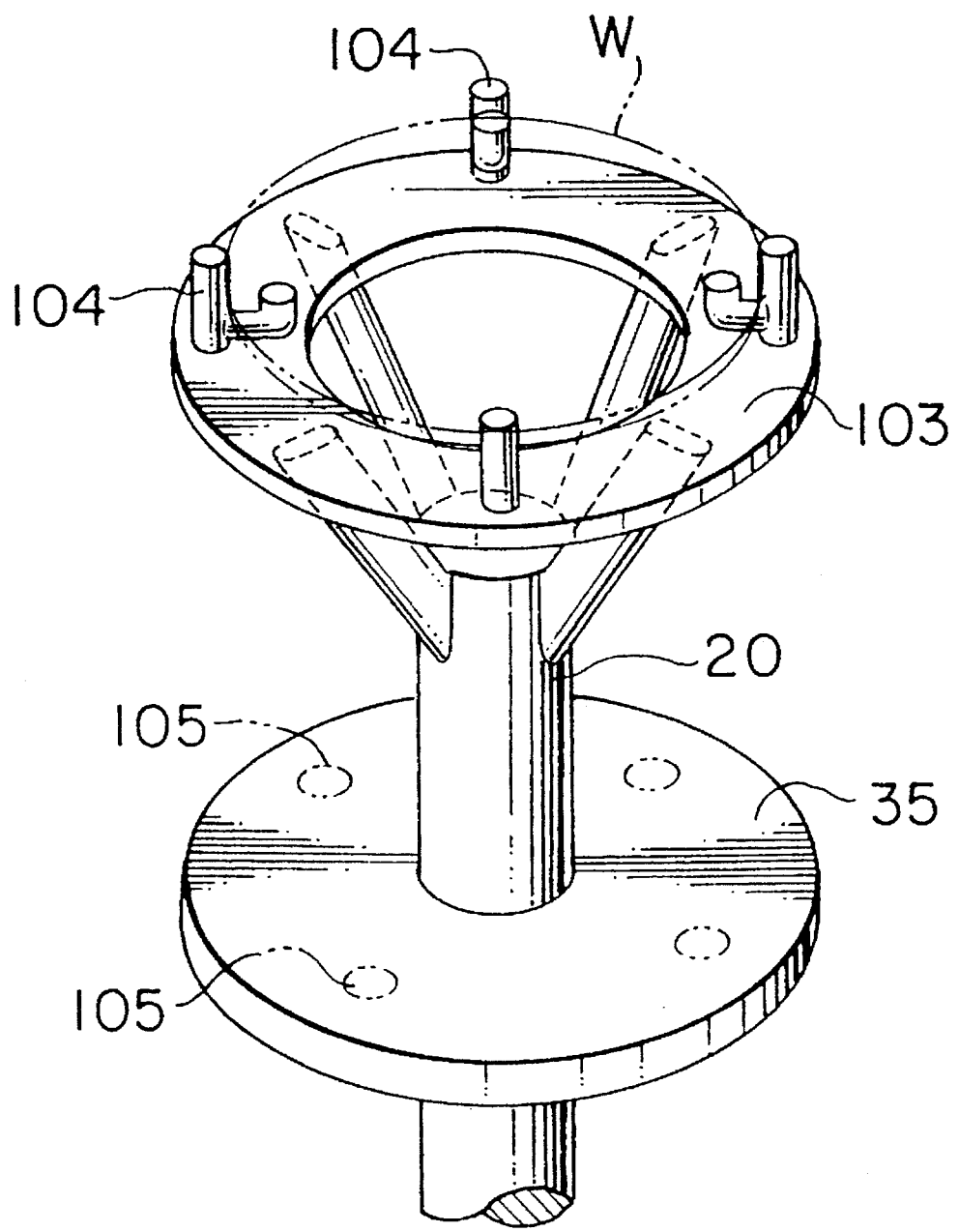
FIG. 24 is a perspective view of an object mount portion of the apparatus of FIG. 19.

In the present embodiment, as shown in FIG. 24, a mount portion 21 of the object holder 20 is provided with a plurality of mounting supports 104 (four in number in the illustrated case) which are arranged in the circumferential direction along the upper surface of a ring-shaped cradle 103. The cradle 103 is designed so as not to interfere with radiant heat rays from the heat equalizing members 100 to 102 which are situated on the reverse side of the object W. It is to be understood that the mount portion 21 may be of any other suitable construction.

Figure 19:
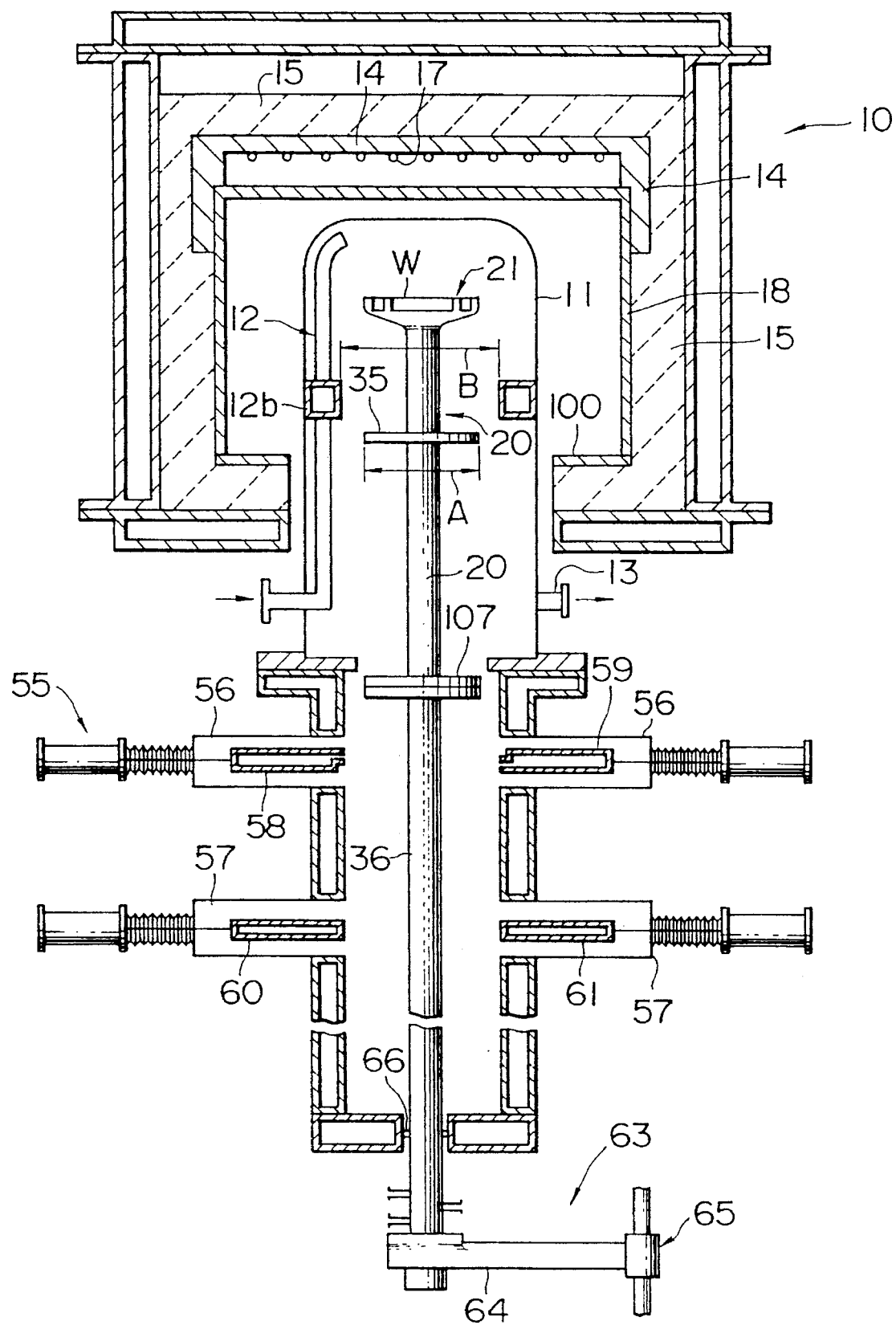
FIG. 19 is a schematic front view of a heat treatment apparatus according to a third embodiment of the invention.

As shown in FIG. 19, moreover, a heat shield member 35 serves to cut off radiant heat from the inside of a heat treatment section, seal the process gas in the treatment section, and rectify a gas flow produced as the object W moves.

Heat from the heat equalizing members 100 to 102 on the reverse side of the object W is accumulated in the heat shield member 35. Thus, the member 35 has a function to preheat the object W set in place.

Also, the heat shield member 35 serves to rectify a gas flow which accompanies the movement of the object W moves. Thus, the outside diameter (A) of the shield member 35 is adjusted so that a gap is formed between the member 35 and the inner wall surface of a preheating portion 12b of a gas charging pipe 12, as shown in FIG. 19, lest a rapid gas flow be caused when the mount portion 21 is moved from the treatment position to load or unload the object W. In the present embodiment, for example, the outside diameter of the heat shield member 35 is about 5 mm to 30 mm smaller than the inside diameter (B) of the preheating portion 12b.

This arrangement is intended to prevent the object W from being subject to an in-plane temperature difference when the object holder 20 moves from a heat treatment unit 10 after heat treatment, for example. Thus, when each two adjacent members, such as the preheating portion 12b and the heat shield member 35, move relatively to each other, the gas existing between them, especially the gas in the vicinity of the peripheral edge of the heat shield member 35, produces a gas flow attributable to involvement. The speed of this running gas is influenced by the size of the gap between the two members. If this gap is too narrow, the running gas speed increases drastically, so that a convection is caused in the treatment position which corresponds to a space on one side of the shield member 35. Thereupon, heat radiation from the peripheral edge portion of the object W is accelerated. Accordingly, the outside diameter (A) of the object W is set in the aforesaid manner lest the temperature gradient of the object be changed during the heat treatment. When the object W is moved from the treatment position to be unloaded, moreover, the outside diameter (A) of the heat shield member 35 settled in this manner serves to restrain the increase of the running gas speed, thereby preventing the in-plane temperature difference of the object W. When the object W is moved to be loaded or unloaded, therefore, the gas sometimes may flow at a certain speed around the shield member 35. Even in this case, the running gas never acts in the treatment position, so that the so-called convection can be prevented in the treatment position, and the object W is not subject to any in-plane temperature difference.

According to the present embodiment, furthermore, the heat shield member 35 is penetrated by a plurality of gas relief holes 105 arranged in the circumferential direction thereof. The relief holes 105 reduce the involvement of the gas in the vicinity of the peripheral edge portion of the object W. It is to be understood that the shield member 35 is not limited to the shape of a pot lid, and may be designed so that it can restrain disturbance of the gas or generation of the gas speed. For example, the shield member 35 may be shaped like a combination of two cones, upper and lower. Alternatively, a plurality of heat shield members 35 may be arranged continuous with one another.

FIG. 25 shows a case in which the holder 20 is provided with a plurality of heat shield members. Four shield members 35a, 35b, 35c and 35d are arranged vertically in succession on the holder 20. The lower ones of the members 35a, 35b, 35c and 35d have larger diameters. Three partition plates 106a, 106b and 106c are fixed to the inner wall of the processing tube 11. The lower ones of the plates 106a, 106b and 106c have larger inside diameters. The partition plates 106a, 106b and 106c serve to cut off radiant heat from the heat treatment unit 10 and prevent a temperature gradient from being generated between the unit 10 and the region thereunder, thereby preventing production of a gas flow.

Each of the heat shield members 35a, 35b, 35c and 35d may be provided with a plurality of gas relief holes such as the ones shown in FIG. 24. In this case, the relief holes of one of the shield members 35a, 35b, 35c and 35d are situated in positions different from the positions of those of another. Also, each of the partition plates 106a, 106b and 106c may be provided with similar gas relief holes. The second, third, and fourth shield members 35b, 35c and 35d are arranged so that they are situated below the partition plates 106a, 106b and 106c, respectively, when the mount portion 21 of the holder 20 is in the treatment position.

The arrangement of the heat shield members shown in FIG. 25 is intended for the case where the preheating portion 12b is removed from the gas charging pipe 12 in the processing tube 11 shown in FIG. 19. Like the arrangement shown in FIG. 19, however, this arrangement of the shield members is applicable to the case where the charging pipe 12 is provided with the preheating portion 12b. FIG. 26 shows this arrangement. In the case shown in FIG. 26, lower preheating portions 12b of the charging pipe 12 have greater inside diameters than upper ones.

Figure 27:
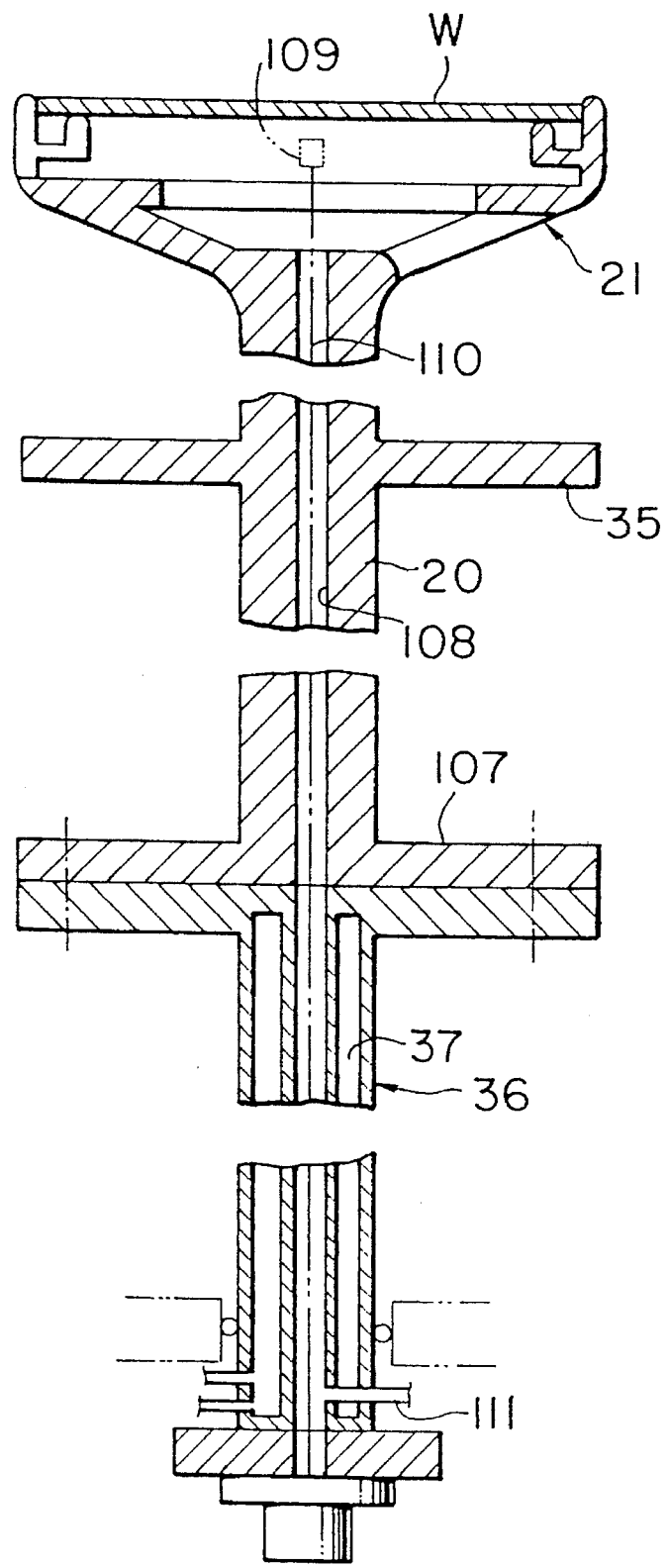
FIG. 27 is a schematic front view of a modification of an object holder of the apparatus of FIG. 19.

As shown in FIGS. 19 and 27, the object holder 20 is provided with another heat shield member 107. The shield member 107 is formed of a flange, which is connected to a cooling rod 36 situated under its end portion. The member 107 serves to cover a region near a bottom opening of the processing tube 11, thereby keeping the radiant heat from an object loading/unloading unit 40, when the mount portion 21 of the object holder 20 is situated in the treatment position for the object W in the heat treatment unit 10. The uppermost heat shield member 35a, as shown in FIGS. 25 and 26, may be used to heat the reverse of the object W. Moreover, the central portion and peripheral edge portion of each heat equalizing member situated on the reverse side may be formed of different materials such that their temperatures are different from each other. Naturally, in this case, the temperature of the peripheral edge portion, which radiates more heat, is set to be higher.

As shown in FIG. 27, a through hole 108 extends through the center of the object holder 20 and the cooling rod 36 to the mount portion 21. The hole 108 is penetrated by a lead wire 110 of a thermometer 109 for measuring a treatment temperature in the heat treatment unit 10 in an approximate manner. The thermometer 109 is located on the reverse side of the object W, and serves to detect its surface temperature. Instead of being used for the lead wire 110 of the thermometer 109, moreover, the through hole 108 may be used as an optical path which leads to an optical temperature sensor for detecting the temperature of the object W by its surface color, for example. A charging pipe 111 for a purging gas, such as nitrogen gas, opens into a part of the through hole 108, whereby the hole 108 can be purged.

Figure 28A:
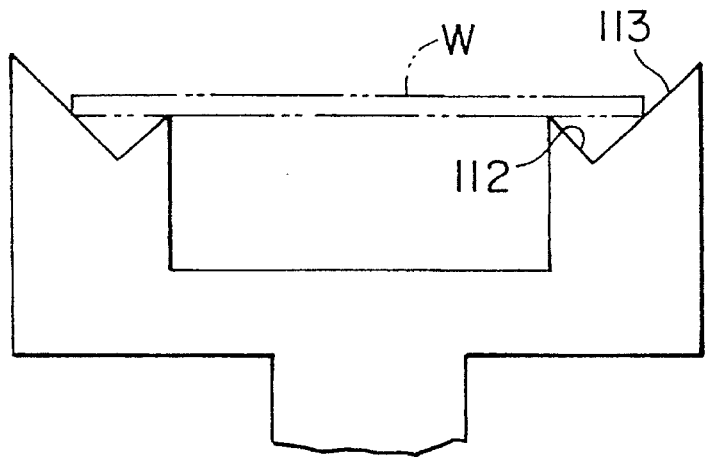
FIG. 28A is a schematic front view of a mount portion according to a first modification of the object holder of the apparatus of FIG. 19.
Figure 28B:
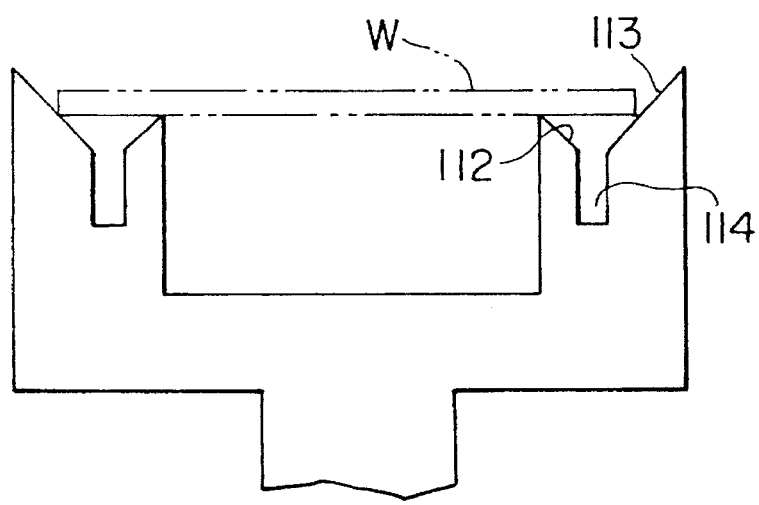
FIG. 28B is a schematic front view of a mount portion according to a second modification.
Figure 28C:
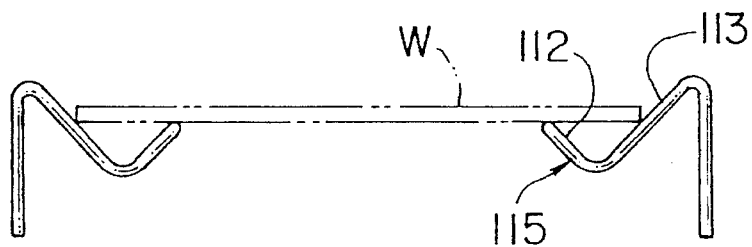
FIG. 28C is a schematic front view of a mount portion according to a third modification.

In order to prevent the temperature distribution from being unequalized by heat radiation in the plane of the object W, the mount portion 21 should be designed so that the area of its contact with the object W is relatively small. According to the present invention, mounting structures shown in FIGS. 28A, 28B, and 28C may be used in place of the mounting supports 104 of the mount portion 21 shown in FIG. 24. The structure shown in FIG. 28A is formed having gradient faces 112 and 113 which intersect substantially at right angles to each other. The one gradient face 112 carries the object W on its top edge, while the other gradient face 113 serves as a guide face for centering. In the structure shown in FIG. 28B, a relief portion 114 for a cutting tool, which is used to form the intersecting gradient faces 112 and 113 shown in FIG. 28A, is formed in the position where the gradient faces meet each other. Thus, the machinability is improved. The structure shown in FIG. 28C is provided with a rod member 115 which have intersecting gradient faces 112 and 113.

Figure 29:
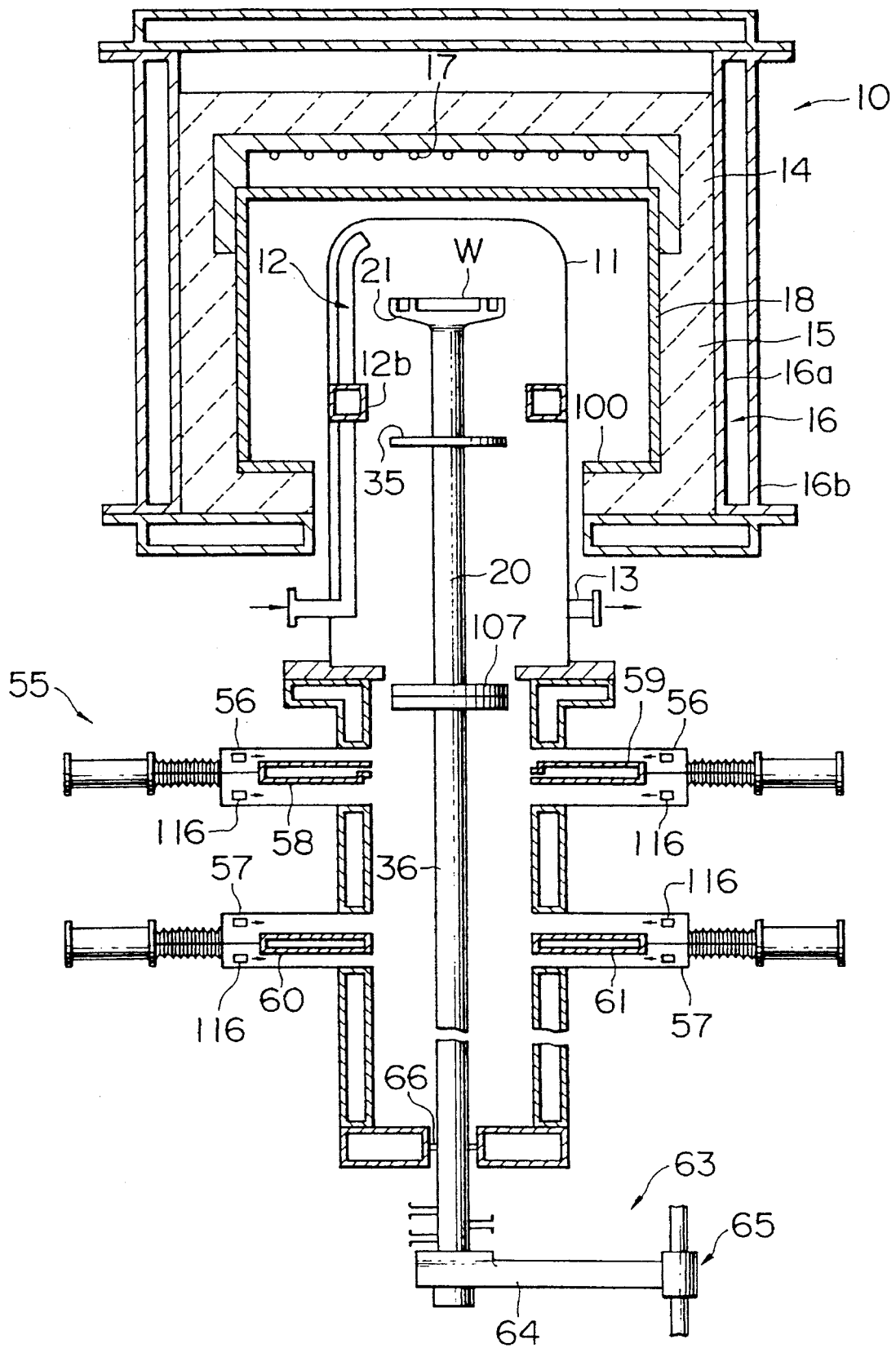
FIG. 29 is a schematic front view of a heat treatment apparatus according to a modification of the third embodiment of the invention.

As shown in FIG. 29, an airtight delivery chamber 3 in which first and second shutters 56 and 57 are located is provided with a changing structure for the ambient gas of the object W. More specifically, a moving portion of each of the first and second shutters 56 and 57 has injection nozzles 116 which are arranged at regular intervals in the circumferential direction. The nozzles 116 are used to spray an inert gas such as helium, which is different from the process gas. Immediately when the object W is carried out from the heat treatment unit 10, the injection nozzles 116 change the ambient gas from the process gas atmosphere, thereby keeping the object W away from the process gas. Thus, undesired films can be prevented from being formed in the course of transportation of the object W. This ambient gas is changed at once, so that the object W is brought into contact with the inert gas which has not been influenced by heat from the treatment unit 10. Accordingly, the so-called thermal budget or heat balance of the object W is stabilized, so that unevenness of the in-plane temperature distribution can be restrained. Exhaust ports (not shown) as many as the injection nozzles 116 are arranged at regular intervals in the circumferential direction lest they interfere with the nozzles 116. The injection nozzles 116 have a plurality of jet holes which are arranged vertically and serve to jet a cooling gas in the horizontal direction. Thus, the cooling gas is ejected parallel to the surface of the object W in its retreated position.

The following is a description of the third embodiment.

When the delivery of the object W to the mount portion 21 is completed, the object holder 20 is raised. In the course of this ascent of the holder 20, the object W is placed in the process gas atmosphere the moment it is moved from the helium gas atmosphere in the gas changing structure into the heat treatment unit 10. After reaching a predetermined position, the holder 20 is situated in a position near the inner peripheral surface of the preheating portion 12b of the gas charging pipe 12, and is switched to a rotational frequency for the heat treatment. In the treatment unit 10, the preheated process gas is supplied through the charging pipe 12.

When the heat treatment is started with the supply of the process gas, the first and second shutters 56 and 57 are kept open and closed, respectively. Thereupon, the heat shield member 35 of the holder 20 covers the bottom portion of the heat treatment unit 10. Thus, radiant heat rays leaking from the treatment unit 10 are cut off. In the heat treatment unit 10, moreover, the process gas is sealed to establish a heat treatment environment. At the same time, radiant heat is applied to the obverse and reverse of the object W, especially the peripheral edge portion of the reverse, by means of the heat equalizing members 18, 100, 101 and 102. In consequence, the temperature distribution in the plane of the object W can be equalized.

At the end of the heat treatment, on the other hand, the object holder 20 situates its mount portion 21 under the first shutter 56. At this time, involvement of the gas at the peripheral edge portion can be reduced, since the heat shield member 35 of the holder 20 has the outside diameter (A) predetermined with respect to the gas relief holes and the preheating portion 12b of the gas charging pipe 12. Thus, heat radiation from the peripheral edge portion of the object W is restrained, so that the in-plane temperature distribution can be prevented from becoming uneven.

In the holder 20 situated below the first shutter 56, the object W on the mount portion 21 rotates at a changed rotational frequency of, e.g., about 60 rpm. At the same time, heat insulation between the heat treatment unit 10 and the object loading/unloading unit 40 is effected with use of the helium gas supplied from the moving portions of the shutters. Also, the ambient gas atmosphere is changed, and the object W is cooled. At this time, moreover, the object cooling is accelerated by means of cool air from the first shutter 56 on the upper side.

The object W, thus cooled after the heat treatment, is set in the same state as in the case of the loading operation. In this state, the object W is moved from the position opposite the injection nozzles 116 into the delivery chamber 43. The object W is unloaded reversely following the procedure for the loading operation.

In the present embodiment, the shutters in the airtight chamber located under the bottom opening of the processing tube are used as a cooling structure for the object W, so that the cooling time can be shortened without requiring any special arrangement.

According to the present embodiment, moreover, the heat insulator is provided surrounding the region under the treatment position between the equalizing members and the processing tube, so that the temperature gradient between the obverse and reverse of the object in the heat treatment position can be rationalized. As a result, a gas flow is prevented from being produced by a sudden change of the temperature gradient, and the heat radiation from the peripheral edge portion of the object is restrained.

Fourth Embodiment

Referring now to FIGS. 30 to 33, a heat treatment apparatus according to a fourth embodiment of the present invention will be described.

In the description of the fourth embodiment to follow, like portions or members used in the first to third embodiments are designated by like symbols or numerals, and a description of those portions is omitted.

This fourth embodiment is characterized in that an object holder 20 is provided with reflecting members in place of the heat shield member 35, whereby the reverse of the object W is heated.

Figure 30:
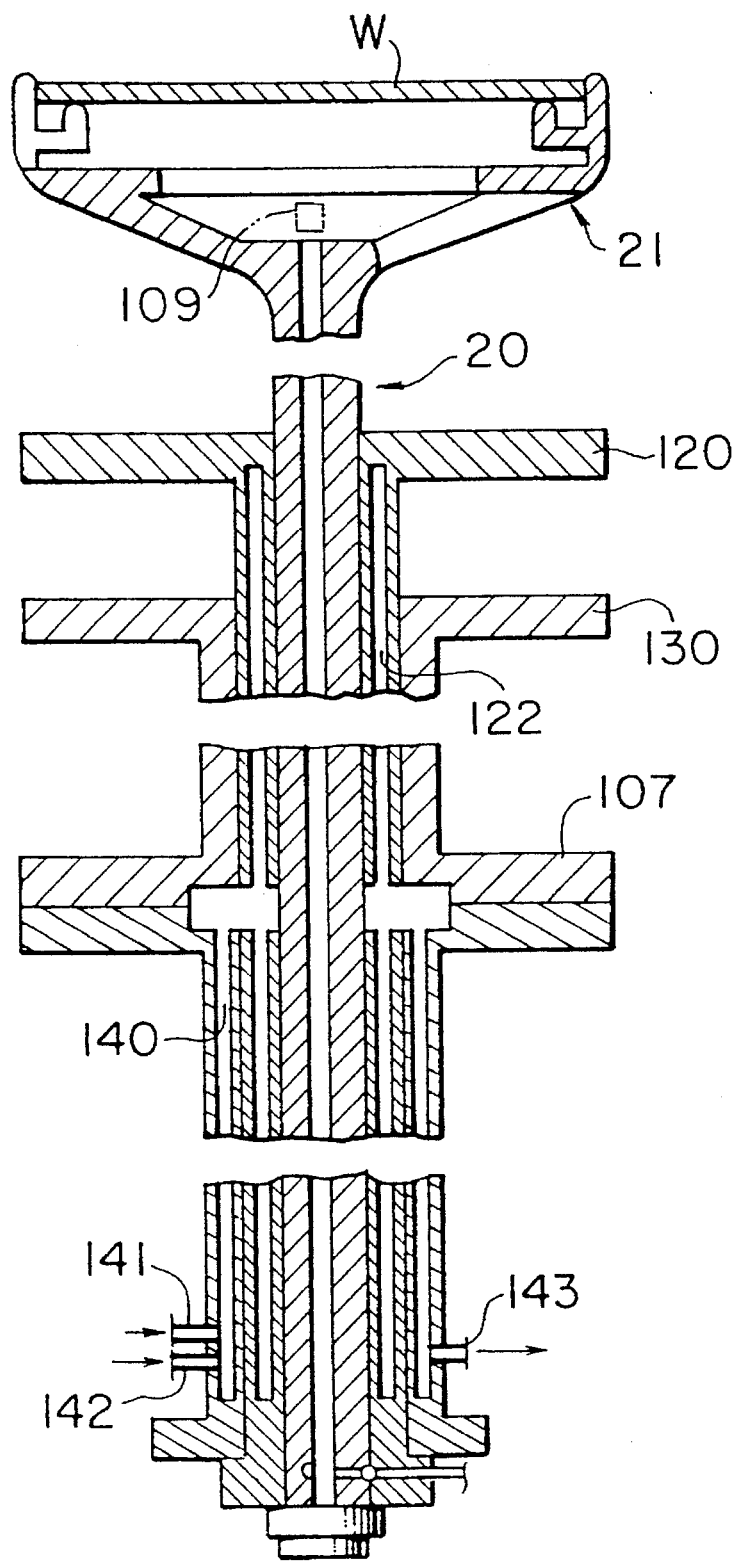
FIG. 30 is a schematic front view of an object holder of a heat treatment apparatus according to a fourth embodiment of the invention.

As shown in FIG. 30, first and second reflecting members 120 and 130 are arranged under a mount portion 21 of the holder 20. The first reflecting member 120 is supported on the holder 20 for independent rotation and up-and-down motion. Although the second reflecting member 130 is fixed to the holder 20, it may preferably be arranged so that it can move integrally with the first reflecting member 120 in the vertical direction. Although only the first reflecting member 120 is rotatable in this example, it is necessary only that the first and second reflecting members 120 and 130 be rotatable relatively to each other.

The first and second reflecting members 120 and 130 are arranged in place of the heat shield member 35 of the embodiment shown in FIG. 19. Those respective surfaces of the members 120 and 130 which face the mount portion 21 are formed of, for example, planished silicon carbide (SiC).

A plurality of regions with different efficiencies of reflection are arranged at regular intervals in the circumferential direction, on the surface of each of the first and second reflecting members 120 and 130. These regions are varied in radiant heat transmission factor.

Figure 31:
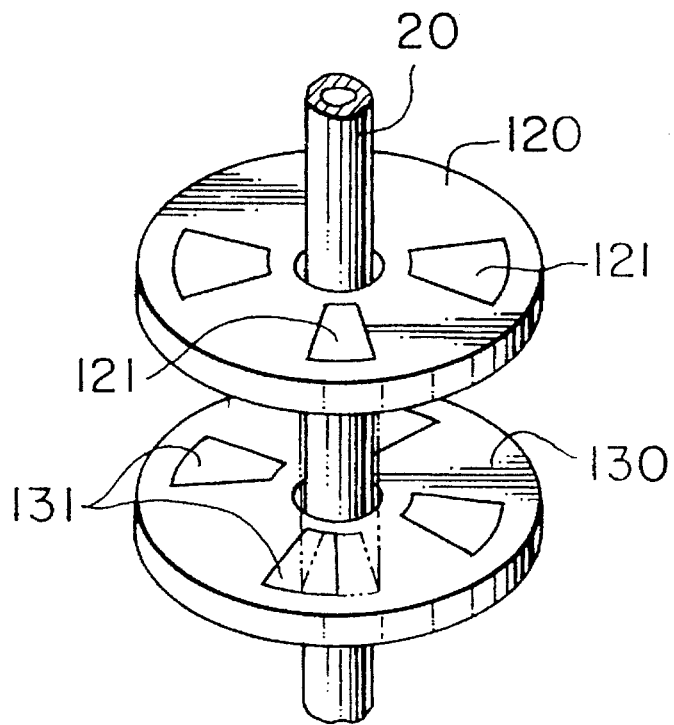
FIG. 31 is a perspective view of a mount portion of the object holder of the apparatus of FIG. 30.

According to the present embodiment, as shown in FIG. 31, transmitting portions 121 are formed at regular intervals in the circumferential direction, in the first reflecting member 120, while heat ray absorbing portions 131 are formed in the second reflecting member 130, corresponding to the transmitting portions 121, individually. In this structure, transparent and opaque portions may be alternately arranged for varied transmission factors. In this case, transparent quartz is selected as a material for the transmitting portions, and is opaqued to be varied in transmission factor in its circumferential direction. The opaque portion may be formed by distributively arranging silicon carbide which is a gray material. When using this silicon carbide, radiant heat can be absorbed without being reflected, so that it may be used as manufactured energy to be emitted from the opaque portion.

As the first and second reflecting members 120 and 130 rotate relative to each other, laps between the transmitting portions 121 of the first member 120 and the heat ray absorbing portions 131 of the second member 130 change, whereby the quantity of reflected heat from the second reflecting member 130 to the object W can be adjusted.

In order to regulate these laps, according to the present embodiment, a temperature sensor 109 is provided for detecting temperatures at the peripheral edge portion of the object W and in the vicinity of the center thereof, at the least. The laps between the transmitting portions 121 and the heat ray absorbing portions 131 are regulated in accordance with the detected temperatures from the sensor 109, whereby the quantity of reflected heat applied to the object W is adjusted.

The upper surface portion of the first reflecting member 120, which faces the reverse of the object W, may be formed having a concave profile thinner in the central portion than in the peripheral edge portion. In this case, the angle θ of inclination of the concave profile is adjusted to a value such that heat rays reflected on the reverse of the object W can advance.

Figure 32:
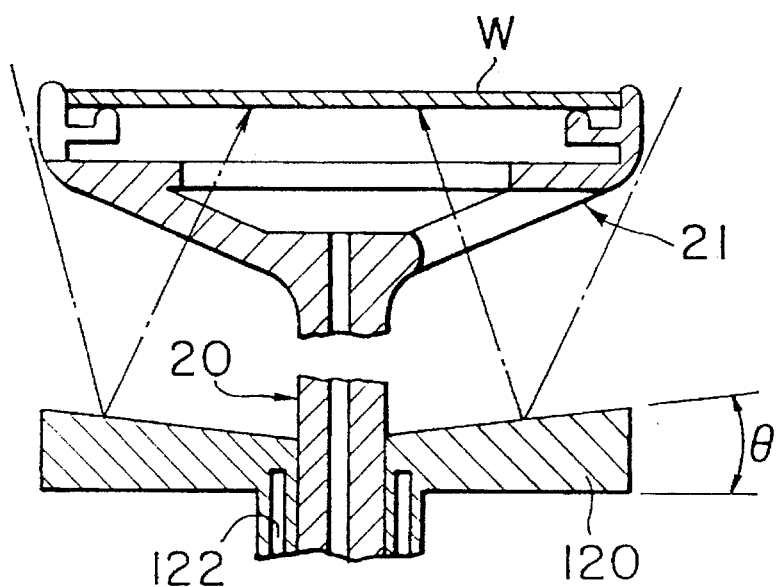
FIG. 32 is a sectional view of the mount portion of the object holder of the apparatus of FIG. 30.

As shown in FIGS. 30 and 32, a hollow portion 122 is formed in the first reflecting member 120. A heating or cooling medium is introduced into the hollow portion 122.

The second reflecting member 130 is used as a structure for feeding the medium into the first reflecting member 120, as shown in FIG. 30. More specifically, a heat shield member 107 has a circuit 140 therein which communicates with the hollow portion 122 of the first reflecting member 120. The circuit 140 partially includes passages 141, 142 and 143 through which the medium can be externally supplied and recovered. Thus, the medium loaded into the circuit 140 circulates in the hollow portion 122 of the first reflecting member 120, and is discharged through the circuit 140. In FIG. 30, black dots represent sealing members at junctions.

The supply timing for the heating medium is the time when the mount portion 21 of the holder is situated correspondingly to the preheating portion as the holder 20 moves toward the treatment position. The supply timing for the cooling medium is the time when the holder 20 starts to move toward an object loading/unloading unit 40. Thus, the preheating effect can be improved at the time of heating, and the object W can be loaded and unloaded at a temperature near the normal temperature at the time of cooling. The object W moving to be unloaded is adjusted to a temperature not higher than the treatment temperature when it leaves the treatment position. Accordingly, there is no possibility of an undesired natural oxide film or the like being formed on the object W.

The following is a description of the fourth embodiment. A description of those processes which have already been described in connection with the first to third embodiments will be omitted.

When the temperature of the object W reaches a predetermined point at the preheating portion, the holder 20 is raised to the treatment position. Thereupon, the object W is subjected to radiant heat from equalizing members 18, 100, 101 and 102 to be increased in temperature, and is heated by means of reflected heat rays from the first reflecting member 120.

If it is concluded by the temperatures detected by means of the temperature sensor 109 that the in-plane temperature of the object W is uneven, at this time, the relative positions of the transmitting portions 121 of the first reflecting member 120 and the heat ray absorbing portions 131 of the second reflecting member 130 are changed.

If the distance between the first reflecting member 120 and the mount portion 21, besides the efficiency of reflection, is changed independently of the holder 20, moreover, the temperature can be adjusted without affecting the in-plane uniformity of the object W.

Furthermore, the increase in temperature of the reverse of the object W is accelerated depending on the surface configuration of the first reflecting member 120.

It is to be understood that the present invention is not limited to the embodiments described above, and that various changes and modifications may be effected therein by one skilled in the art without departing from the scope or spirit of the invention.

The object of treatment according to the present invention must only be a planar object, and may be an LCD, as well as a semiconductor wafer. Moreover, the heat treatment apparatus to which the present invention is applied may, for example, be an apparatus for oxidation, diffusion, or annealing, as well as a CVD apparatus.

What is claimed is:

1. A heat treatment apparatus comprising:

a vertical processing tube having a bottom opening through which an object of treatment is loaded and unloaded and including an elevated heat source for heating the object in a treatment position;

an object holder including a mount portion for carrying the object thereon and for loading the object on the mount portion into the treatment position through the bottom opening of the processing tube;

a first temperature sensor located facing the obverse side of the object on the mount portion, for measuring a temperature at the obverse side of the object;

a second temperature sensor located facing the reverse side of the object on the mount portion, for measuring a temperature at the reverse side, the first and second temperature sensors being supported by the object holder; and means for detecting the temperature of the object in accordance with the respective outputs of the first and second temperature sensors.

2. A heat treatment apparatus according to claim 1, wherein said first and second temperature sensors each include a temperature measurer extending to face a side of the object on the mount portion and a protecting tube of quartz covering the temperature measurer.

3. A heat treatment apparatus according to claim 1, wherein said first and second temperature sensors include a plurality of first sensors and a plurality of second sensors arranged individually at the central portion and peripheral edge portion of the object.

4. A heat treatment apparatus according to claim 1, further comprising control means for controlling ascent and descent of the object holder in accordance with the output of the temperature detecting means.

5. A heat treatment apparatus according to claim 2, wherein said control means raises the object in the treatment position toward the heat source when the temperatures measured by the first and second temperature sensors are lowered.

6. A heat treatment apparatus comprising:

a vertical processing tube having a bottom opening through which an object of treatment is loaded and unloaded and including an elevated primary heat source for heating the object in a treatment position by radiation;

an object holder including a mount portion for carrying the object thereon and for loading the object on the mount portion into the treatment position through the bottom opening of the processing tube;

means for supplying a reaction gas to the treatment position in the processing tube; and a secondary heat source adapted to emit secondary radiant heat rays toward a reverse side of the object in the treatment position when heated by means of the primary heat source, thereby heating at least a peripheral edge portion of the object.

7. A heat treatment apparatus according to claim 6, wherein said secondary heat source is located in a region below the treatment position such that the secondary heat source does not interfere with the path of ascent and descent of the holder.

8. A heat treatment apparatus comprising:

a vertical processing tube having a bottom opening through which an object of treatment is loaded and unloaded and including an elevated heat source for heating the object in a treatment position;

an object holder including a mount portion for carrying the object thereon and for loading the object on the mount portion into the treatment position through the bottom opening of the processing tube;

means for supplying a reaction gas to the treatment position in the processing tube; and reflecting means for reflecting incident heat rays, emitted directly or indirectly from the heat source, on reverse side of the object, thereby heating at least a peripheral edge portion of the object.

9. A heat treatment apparatus according to claim 8, wherein said reflecting means is mounted on a portion of the object holder situated under the object in the treatment position.

10. A heat treatment apparatus according to claim 9, wherein said reflecting means is movably mounted on the object holder so that the distance from the object to the reflecting means at the treatment position can be adjusted.

11. A heat treatment apparatus according to claim 9, wherein said reflecting means includes at least two reflecting members located in different positions in the axial direction of the holder, the reflecting members having regions with different individual heat ray reflection factors, such that the relative positions of the regions with the different reflection factors vary.

* * * * *

UNITED STATES PATENT AND TRADEMARK OFFICE
CERTIFICATE OF CORRECTION

PATENT NO.   : 5,571,010
DATED        : November 5, 1996
INVENTOR(S)  : Wataru OKASE It is certified that error appears in the above-indentified patent and that said Letters Patent is hereby corrected as shown below:

<u>ON THE TITLE PAGE:</u>
in the listing of "References Cited" (Item [56]), under the heading "FOREIGN PATENT DOCUMENTS," please insert:
-- 63-133521    6/1988    Japan --.

Signed and Sealed this

Fifteenth Day of December, 1998

Attest:

BRUCE LEHMAN

*Attesting Officer*          *Commissioner of Patents and Trademarks*